US012604417B2

(12) United States Patent
Mukai et al.

(10) Patent No.: US 12,604,417 B2
(45) Date of Patent: Apr. 14, 2026

(54) COPPER CLAD LAMINATE AND METHOD FOR PRODUCING THE SAME

(71) Applicant: TOYO KOHAN CO., LTD., Tokyo (JP)

(72) Inventors: Nobuaki Mukai, Yamaguchi (JP); Takahiro Yoshida, Yamaguchi (JP); Youhei Yoshimatsu, Yamaguchi (JP)

(73) Assignee: TOYO KOHAN CO., LTD., Tokyo (JP)

( * ) Notice: Subject to any disclaimer, the term of this patent is extended or adjusted under 35 U.S.C. 154(b) by 569 days.

(21) Appl. No.: 18/040,236

(22) PCT Filed: Aug. 7, 2021

(86) PCT No.: PCT/JP2021/029461
§ 371 (c)(1),
(2) Date: Feb. 1, 2023

(87) PCT Pub. No.: WO2022/030644
PCT Pub. Date: Feb. 10, 2022

(65) Prior Publication Data

US 2023/0284393 A1 Sep. 7, 2023

(30) Foreign Application Priority Data

Aug. 7, 2020 (JP) ................................ 2020-134874
Jun. 3, 2021 (JP) ................................ 2021-093953

(51) Int. Cl.

| | |
|---|---|
| ***H05K 3/18*** | (2006.01) |
| ***H05K 1/02*** | (2006.01) |
| ***H05K 1/03*** | (2006.01) |

(52) U.S. Cl.
CPC ............ *H05K 3/184* (2013.01); *H05K 1/028* (2013.01); *H05K 1/032* (2013.01); *H05K 2203/1105* (2013.01)

(58) Field of Classification Search
CPC .......... H05K 3/18; H05K 3/184; H05K 1/028; H05K 1/032; H05K 2203/1105
(Continued)

(56) References Cited

U.S. PATENT DOCUMENTS 6,534,117 B1 3/2003 Yoshio et al.

FOREIGN PATENT DOCUMENTS

EP 2555601 A1 2/2011
JP 2001020077 A 1/2001
(Continued)

*Primary Examiner* — Tremesha W Burns
(74) *Attorney, Agent, or Firm* — FISHERBROYLES, LLP; Roger L. Browdy

(57) ABSTRACT

[Object]
To provide a copper clad laminate that is capable of achieving high adhesion between a low dielectric resin film and a copper plating layer and a good volume resistivity while suppressing a transmission loss when being applied to a flexible circuit board, and a method for producing the copper clad laminate.
[Solving Means]
A copper clad laminate of the present invention includes a low dielectric resin film having a relative permittivity of 3.5 or lower and a dissipation factor of 0.008 or lower at a frequency of 10 GHz, and an electroless copper plating layer laminated on at least one surface of the low dielectric resin film. A weighted average size of crystallites in the electroless copper plating layer is 25 to 300 nm, and an adhesion strength between the resin film and the electroless copper plating layer is 4.2 N/cm or more.

16 Claims, 7 Drawing Sheets

(58) Field of Classification Search
USPC .......................................................... 174/254
See application file for complete search history.

(56) References Cited

FOREIGN PATENT DOCUMENTS

| | | | |
|---|---|---|---|
| JP | 2002-93747 | A | 3/2002 |
| JP | 2002-256443 | A | 9/2002 |
| JP | 2003-1756 | A | 1/2003 |
| JP | 2005-171287 | A | 6/2006 |
| JP | 2007-154306 | A | 6/2007 |
| JP | 2007-262493 | A | 10/2007 |
| JP | 2007-305660 | A | 11/2007 |
| JP | 2009-246200 | A | 10/2009 |
| JP | 2009-274250 | A | 11/2009 |
| JP | 2012-23296 | A | 2/2012 |
| JP | 2012-112028 | A | 6/2012 |
| JP | 2015-12055 | A | 1/2015 |
| JP | 2017208540 | A | 11/2017 |

(a)

(b)

COPPER CLAD LAMINATE AND METHOD FOR PRODUCING THE SAME

TECHNICAL FIELD

The present invention relates to a copper clad laminate for a flexible circuit board to be mounted on communication equipment or the like and a method for producing the copper clad laminate, and also to a flexible circuit board using the copper clad laminate.

BACKGROUND ART

Downsizing and performance enhancement of electronic equipment in recent years are remarkable, significantly contributing to the development of mobile phones and communication equipment using radio waves such as a wireless LAN (Local Area Network).

Especially nowadays, accompanying a trend toward larger-capacity information typified by big data in IoT (Internet of Things), there is an increasing adoption of higher frequencies for communication signals between pieces of electronic equipment, so that a material having a low transmission loss (dielectric loss) in a high frequency range is required for a circuit board to be mounted on such communication equipment.

Here, a dielectric loss that occurs in such a circuit board is known to be proportional to the product of three elements consisting of "the frequency of a signal," "a square root of a dielectric constant of a board material" and "a dissipation factor." In order to obtain the above-described excellent dielectric characteristics, a material that is as low as possible in both dielectric constant and dissipation factor is hence required obviously.

In such a circuit board, a circuit is generally formed using metal such as copper. A copper layer in this circuit board is formed, for example, by a laminating process disclosed in PTL 1, a casting process disclosed in PTL 2, a plating process disclosed in PTL 3, or the like.

CITATION LIST

Patent Literature

[PTL 1]
JP 6202905B
[PTL 2]
JP 5186266B
[PTL 3]
JP 2002-256443A

SUMMARY

Technical Problems

As mentioned above, it has become an important element of development in recent years to reduce the transmission loss in high frequency communications, and therefore, resin films having a low transmission loss (which may hereinafter be also called "low dielectric films" or "low dielectric resin films") are finding utility as base materials for flexible circuit boards.

Such a flexible circuit board (which may hereinafter be also called an "FPC") includes a conductive film of copper or the like formed on a low dielectric film, for example, by sputtering, plating, or other processes. If the FPC is produced by sputtering out of these processes, the production process is complex, and as a result, many problems remain in productivity and cost aspects.

According to the plating process disclosed in PTL 3, on the other hand, relatively good adhesion of a resin film having a high dielectric constant with a copper layer can be assured. If copper plating is applied as a conductive film as in PTL 3, however, electroless copper plating is applied before electrolytic copper plating in order to form a plating seed layer for carrying out electroplating in a subsequent stage. The excellent conductive characteristics are needed for FPCs in recent years as mentioned above. Nonetheless, there has been no case in which an attention was paid to the relation between the electrolytic copper plating layer and the electroless copper plating layer. A large room for improvement is therefore considered to exist.

Further, as production processes of an FPC, semi-additive processes (SAP, MSAP (Modified SAP)) and the like are attracting attention as substitutes for the subtractive process, but the current plating process causes a problem in a resist removing process. There is accordingly a desire for a formation method of a conductive film which can also be actually applied to such a new production process.

The present invention is intended to solve the above-described problems as an example, and the object thereof is to provide a copper clad laminate that is capable of achieving high adhesion between a low dielectric resin film and a copper plating layer while suppressing a transmission loss when being applied to a flexible circuit board, and a method for producing the copper clad laminate. In addition, a further object of the present invention is to provide a highly densified, flexible circuit board or the like to meet a trend toward high densification of flexible circuit boards.

Solution to Problems (1) To solve the above-described problems, according to an embodiment of the present invention, there is provided a copper clad laminate that includes a low dielectric resin film having a relative permittivity of 3.5 or lower and a dissipation factor of 0.008 or lower at a frequency of 10 GHz, and an electroless copper plating layer laminated on at least one surface of the low dielectric resin film, in which a weighted average size of crystallites in the electroless copper plating layer is 25 to 300 nm, and an adhesion strength between the resin film and the electroless copper plating layer is 4.2 N/cm or more.

(2) In the copper clad laminate described above in (1), the electroless copper plating layer may preferably have a volume resistivity of 7.0 μΩ·cm or lower.

(3) Preferably, the copper clad laminate described above in (1) or (2) may further include an electrolytic copper plating layer laminated on the electroless copper plating layer, in which a weighted average size of crystallites in the electrolytic copper plating layer may be 40 to 300 nm.

(4) Preferably, the copper clad laminate described above in any one of (1) to (3) may further include an electrolytic copper plating layer laminated on the electroless copper plating layer, in which, assuming that the weighted average size of the crystallites in the electroless copper plating layer is first crystallites and the weighted average size of the crystallites in the electrolytic copper plating layer is second crystallites, a ratio of the weighted average size of the second crystallites to the weighted average size of the first crystallites (the weighted average size of the second crystallites/the weighted average size of the first crystallites) may be 2.0 or smaller.

(5) Also, to solve the above-described problems, according to another embodiment of the present invention, there is provided a copper clad laminate that includes a low dielectric resin film having a relative permittivity of 3.5 or lower and a dissipation factor of 0.008 or lower at a frequency of 10 GHz, and an electroless copper plating layer laminated on at least one surface of the low dielectric resin film, in which the copper clad laminate includes an electrolytic copper plating layer on the electroless copper plating layer, a weighted average size of crystallites in the electrolytic copper plating layer is 40 to 300 nm, assuming that a weighted average size of crystallites in the electroless copper plating layer is first crystallites and the weighted average size of the crystallites in the electrolytic copper plating layer is second crystallites, a ratio of the weighted average size of the second crystallites to the first crystallites (the weighted average size of the second crystallites/the weighted average size of the first crystallites) is 2.0 or smaller, and an adhesion strength between the resin film and the electroless copper plating layer is 4.2 N/cm or more.

(6) In the copper clad laminate described above in (5), the weighted average size of the crystallites in the electroless copper plating layer may preferably be 25 to 300 nm.

(7) In the copper clad laminate described above in any of (3) to (6), the electrolytic copper plating layer may preferably have a volume resistivity of 5.0 μΩ·cm or lower.

(8) In the copper clad laminate described above in any of (1) to (7), the low dielectric resin film may preferably include any of polyimides, modified polyimides, liquid crystal polymers, and fluorinated resins, or a mixture thereof.

(9) In the copper clad laminate described above in any of (1) to (8), preferably, the low dielectric resin film may have an average surface roughness Ra of 1 to 150 nm on a plating-layer-side interface where the low dielectric resin film is in contact with the electroless copper plating layer, the resin film may have an intensity of 800 or more at m/z 121 on the plating-layer-side interface as measured by time-of-flight secondary ion mass spectroscopy (TOF-SIMS (Time-of-Flight Secondary Ion Mass Spectroscopy)), and the resin film may be provided on the plating-layer-side interface with hydroxyl groups and/or carboxyl groups.

(10) Also, to solve the above-described problems, according to an embodiment of the present invention, there is provided a method for producing a copper clad laminate by forming an electroless copper plating layer on a low dielectric resin film having a relative permittivity of 3.5 or lower and a dissipation factor of 0.008 or lower at a frequency of 10 GHz, the method including an electroless copper plating step of forming the electroless copper plating layer on a surface of the low dielectric resin film, and a heating step of heating the copper clad laminate in which the electroless copper plating layer has been formed, such that a weighted average size of crystallites in the electroless copper plating layer becomes 25 to 300 nm.

(11) In the method for producing a copper clad laminate described above in (10), the copper clad laminate may preferably be heated in the heating step under either (i) heating conditions of 150° C. to 200° C. for 10 to 180 minutes in an atmosphere or (ii) heating conditions of 150° C. to 350° C. for 5 to 180 minutes in an inert gas.

(12) Preferably, the method for producing a copper clad laminate described above in (10) or (11) may further include an electrolytic copper plating step of forming an electrolytic copper plating layer on the electroless copper plating layer, in which the heating step may be performed before a resist patterning step is performed onto the electroless copper plating layer.

(13) Preferably, the method for producing a copper clad laminate described above in any of (10) to (12) may further include, before the electroless copper plating step, a first surface modification step of providing carboxyl groups and/or hydroxyl groups on the surface of the low dielectric resin film, a second surface modification step of applying electric charges to the surface on which the carboxyl groups and/or the hydroxyl groups have been provided, by a wet process, and a catalyst adsorption step of causing a catalyst to be adsorbed on the surface to which the electric charges have been applied, in which the electroless copper plating layer may be formed on the surface on which the catalyst has been adsorbed.

(14) Also, to solve the above-described problems, according to an embodiment of the present invention, there is provided a flexible circuit board that includes a circuit formed by the copper clad laminate described above in any of (1) to (9).

(15) Also, to solve the above-described problems, according to an embodiment of the present invention, there is provided a method for producing a flexible circuit board by using a low dielectric resin film, the method including an electroless copper plating step of forming an electroless copper plating layer on the low dielectric resin film having a relative permittivity of 3.5 or lower and a dissipation factor of 0.008 or lower at a frequency of 10 GHz, a resist patterning step of applying a resist onto the electroless copper plating layer and patterning the resist, an electrolytic copper plating step of forming an electrolytic copper plating layer between portions of the patterned resist, and a heating step of, before the resist patterning step, heating the copper clad laminate in which the electroless copper plating layer has been formed, such that a weighted average size of crystallites in the electroless copper plating layer becomes 25 to 300 nm.

(16) Also, to solve the above-described problems, according to an embodiment of the present invention, there is provided a flexible circuit board using a low dielectric resin film with metal wires formed on a low dielectric resin film, in which, assuming that a height of each metal wire from the low dielectric resin film is Hw, a width of a bottom base of the metal wire in contact with the low dielectric film is Lb, a width of an upper surface of the metal wire is Lt, and an inter-wire distance from another adjacent metal wire on the low dielectric resin film is S, the flexible circuit board includes conductors formed by the metal wires each having a conductor shape with a rectangularity A of 2.5 or greater, the rectangularity A being defined by a value (Hw/(Lb−Lt)) obtained by dividing the height of the metal wire by a difference between the width of the bottom base and the width of the upper surface, S of 60 μm or smaller, and a conductor wiring density WD of 10.0 or lower, the conductor wiring density WD being defined by a value (S/A) obtained by dividing the inter-wire distance by the rectangularity of the conductor shape.

(17) Preferably, the flexible circuit board described above in (14) may have the circuit of metal wires formed by the copper clad laminate on the low dielectric resin film, in which, assuming that a height of each metal wire from the low dielectric resin film is Hw, a width of a bottom base of the metal wire in contact with the low dielectric film is Lb, a width of an upper surface of the metal wire is Lt, and an inter-wire distance from another adjacent metal wire on the low dielectric resin film is S, at least some of the metal wires may each have a conductor shape with a rectangularity A of 2.5 or greater, the rectangularity A being defined by a value (Hw/(Lb−Lt)) obtained by dividing the height of the metal wire by a difference between the width of the bottom base and the width of the upper surface, S of 60 μm or smaller, and a conductor wiring density WD of 10.0 or lower, the conductor wiring density WD being defined by a value (S/A) obtained by dividing the inter-wire distance by the rectangularity of the conductor shape.

(18) In the flexible circuit board described above in (16) or (17), preferably, at least four or more conductor layers including the metal wires may be laminated together, and an average thickness obtained by dividing a total thickness of the conductor layers by the number of the conductor layers may be 50 μm or smaller.

Advantageous Effects of Invention

According to the present invention, it has become possible to use a copper clad laminate in such formation of a circuit as forming a resist on an electroless copper plating layer, because high adhesion can be assured without excessive roughening of an interface between a low dielectric film and the electroless copper plating layer while a transmission loss is suppressed. According to the present invention, it is also possible to achieve a good volume resistivity.

DESCRIPTION OF EMBODIMENT

Using FIG. 1, a description will hereinafter be made regarding a copper clad laminate 10 of an embodiment.

<Copper Clad Laminate>

Figure 1:
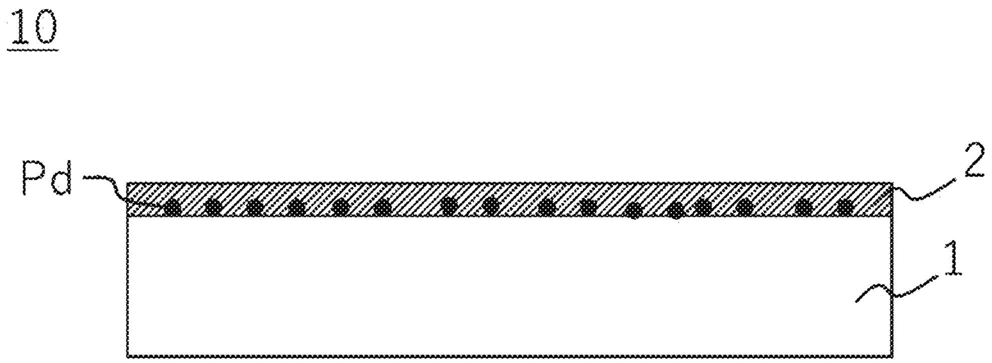
FIG. 1 is a schematic cross-sectional view illustrating a copper clad laminate 10 of an embodiment.

As illustrated in FIG. 1, the copper clad laminate 10 according to the present embodiment has at least a resin film 1 as a base material and an electroless copper plating layer 2 laminated on at least one surface of the resin film 1. Note that, as will be mentioned later using FIG. 4, the copper clad laminate in the present invention may also include an electrolytic copper plating layer 3 formed on the electroless copper plating layer 2.

In the present embodiment, what is called a low dielectric resin film excellent in electrical characteristics in a high frequency range is preferably used as the resin film 1 that serves as the base material.

Specifically, as the low dielectric resin film, a film of a known liquid crystal polymer, fluorinated resin, polyimide resin, modified polyimide resin, epoxy resin, polytetrafluoroethylene resin, polyphenylene ether resin, or the like, which is lower in dielectric loss, is preferably used. These resins may be homopolymers or copolymers. Further, these resins may be used singly, or multiple ones of these resins may be blended together and used as a blend.

Specifically, as electrical characteristics of the resin film 1 that serves as the base material, it is preferred that, at a frequency of 10 GHz, the relative permittivity be 3.5 or lower and the dissipation factor be 0.008 or lower.

As a thickness of the resin film 1, there is no particular limitation, but 5 to 100 μm is preferred for practical use.

Next, a description will be made regarding the electroless copper plating layer 2 laminated on at least one surface of the resin film 1. The electroless copper plating layer 2 in the present embodiment is preferably formed by electroless copper plating. Described specifically, the copper plating layer is formed by electroless plating as the resin film 1 has insulation properties. Further, the electroless copper plating layer 2 may be one which acts as a seed layer when a flexible circuit board is produced by a semi-additive process (SAP or MSAP), a subtractive process, a full-additive process, or the like.

In the present embodiment, the electroless copper plating layer 2 may be plating of a Cu simple substance, or may be a copper alloy plating containing copper in a predetermined amount or more. Examples of the copper alloy include a Cu—Ni alloy, a Cu—Zn alloy, and a Cu—Sn alloy. In the present embodiment, such copper alloy plating should also be included in the "copper plating."

Further, if the electroless copper plating layer 2 is formed of a Cu—Ni alloy, the content of Ni is 3 wt % or lower, preferably 0.01 to 3 wt %, more preferably 0.01 to 1.5 wt %, still more preferably 0.01 to 0.3 wt %.

If the electroless copper plating layer 2 is formed of the Cu—Ni alloy, it is preferred to include Ni having higher plating deposition properties than Cu, because its inclusion suppresses internal stress in the plating layer and is thus considered to also suppress blistering.

Note that, if the content of Ni in the Cu—Ni alloy exceeds 3 wt %, magnetism may occur in the Cu circuit to cause a higher transmission loss, and the etching upon formation of copper wiring may become irksome. The content of Ni in the Cu—Ni alloy is therefore preferably 3 wt % or lower. If the content of Ni in the Cu—Ni alloy is lower than 0.01 wt %, on the other hand, the plating deposition properties are deteriorated.

Note that, as a method for measuring the content of Ni in the electroless copper plating layer 2, a known method using an XRF (X-ray Fluorescence) spectrometer or a plasma emission spectrometer (ICP (Inductively Coupled Plasma)), for example, is available.

In the present embodiment, as an electroless copper plating process for forming the electroless copper plating layer 2, a known process may be used insofar as the electroless copper plating layer 2 having a predetermined thickness can be formed. Note that the details of the electroless copper plating process will be explained in the aspect of a production method to be described subsequently herein.

Further, in the present embodiment, the electroless copper plating layer 2 preferably has a thickness of 0.1 to 1.0 μm from viewpoints of production efficiency and cost.

If the thickness of the electroless copper plating layer 2 is smaller than 0.1 μm, the electroless copper plating layer 2 may not exhibit a function as a seed layer when the flexible circuit board is produced by a semi-additive process. Such a small thickness is therefore not preferred. If the thickness of the electroless copper plating layer 2 is greater than 1.0 μm, on the other hand, it may be difficult to form a fine circuit pattern or the like when producing the flexible circuit board. Such a large thickness is therefore not preferred either.

More preferably, however, the thickness of the electroless copper plating layer 2 is 0.1 to 0.8 μm because a shorter etching time (a smaller thickness) enables the formation of a fine pattern which has smaller impedance variations in the direction of a cross-section of a circuit, especially in the formation of the circuit by an SAP.

In the copper clad laminate 10 of the present embodiment, the above-described resin film 1 is characterized by having an average surface roughness Ra of 1 to 150 nm, suitably 20 to 150 nm, on a plating-layer-side interface where the resin film 1 is in contact with the electroless copper plating layer 2. Especially if the resin film 1 includes a liquid crystal polymer, the average surface roughness Ra of the resin film 1 is desirably 20 to 150 nm on the plating-layer-side interface where the resin film 1 is in contact with the electroless copper plating layer 2. Further, especially if the resin film 1 includes an MPI (Modified Polyimide), the average surface roughness Ra of the resin film 1 is desirably 1 to 150 nm, more preferably 1 to 50 nm, on the plating-layer-side interface where the resin film 1 is in contact with the electroless copper plating layer 2.

The following reason can be attributed to the foregoing.

Described specifically, the copper clad laminate of the present embodiment is desired to have high transmission characteristics at high frequencies in the GHz band or higher such that it can suitably be used in a high-frequency compatible circuit board as mentioned above.

It is commonly known that transmission signals tend to propagate more along a conductor surface owing to the skin effect as they have a higher frequency, and also that the transmission loss increases with the roughness of the conductor surface. In order to reduce the effect of the transmission loss by the skin effect in the present embodiment, it is therefore preferred to decrease the average surface roughness Ra of the electroless copper plating layer 2 which forms wiring conductors, on the interface between the resin film 1 and the electroless copper plating layer 2.

On the other hand, it has heretofore been a common practice to obtain the anchoring effect between the electroless copper plating layer 2 and the resin film 1 by roughening of the interface therebetween, in order to assure adhesiveness between the metal and the resin. As appreciated from the foregoing, the roughness (adhesiveness) and the transmission loss are in a trade-off relation between the electroless copper plating layer 2 and the resin film 1 in the copper clad laminate of the present embodiment.

The present inventors conducted a diligent study to achieve both the characteristics at higher levels. As a result, they came to find that it was preferred to set the average surface roughness Ra of the above-described resin film 1 to 1 to 150 nm on the plating-layer-side interface where the resin film 1 is in contact with the electroless copper plating layer 2 in the present embodiment.

As a result of a continued study by the present inventors, it has come to a conclusion that no preferred adhesiveness can be obtained between the electroless copper plating layer 2 and the resin film 1 if the surface roughness Ra is smaller than 1 nm. If the surface roughness Ra is greater than 150 nm, on the other hand, preferred transmission characteristics may not possibly be obtained at high frequencies due to a transmission loss by the skin effect when the wiring conductors are formed by the electroless copper plating layer 2 on the circuit board as described above. Under such a background, roughening to 300 nm or so is considered to be excessive roughening processing in the present invention.

In the present embodiment, an object thereof is to achieve both a reduction of roughness (a decrease of transmission loss) and adhesiveness between the electroless copper plating layer 2 and the resin film 1 as described above.

As the specific adhesion strength between the electroless copper plating layer 2 and the resin film 1, 4.2 N/cm or more is preferred for practical use. Further, the above-described adhesion strength is more preferably 5.0 N/cm or more, still more preferably 6.4 N/cm or more.

For the assurance of the above-described adhesiveness between the electroless copper plating layer 2 and the resin film 1 in the present embodiment, it is preferred to have the following additional characteristic.

Figure 2:
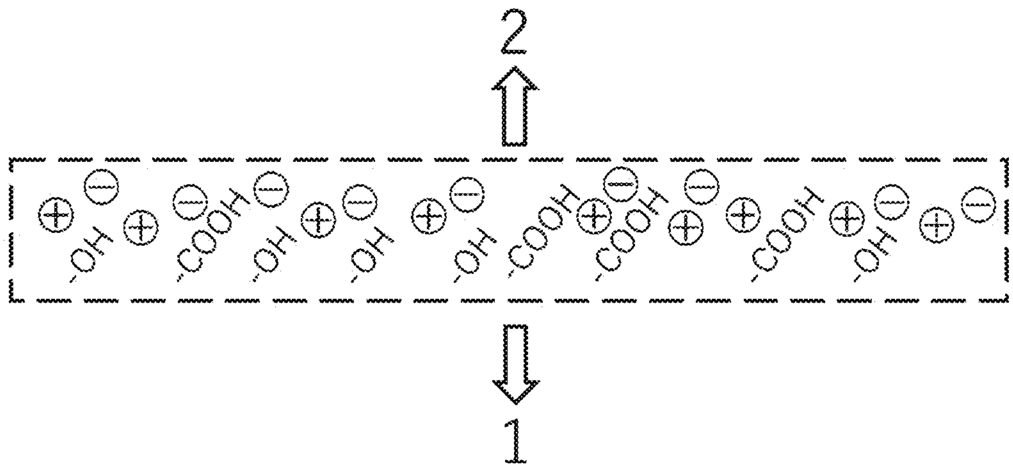
FIG. 2 is a schematic diagram illustrating a state of an interface between a resin film 1 and an electroless copper plating layer in the copper clad laminate 10 of the embodiment.

FIG. 2 schematically illustrates a state of an interface between the resin film 1 and the electroless copper plating layer 2 in the copper clad laminate 10 of the present embodiment. Described specifically, the resin film 1 is preferably provided with hydroxyl groups and/or carboxyl groups on the interface between the resin film 1 and the electroless copper plating layer 2. The following reason is attributed to this.

When the electroless copper plating layer 2 is formed on at least one surface of the resin film 1 by electroless plating in the copper clad laminate 10 of the present embodiment, it is commonly known to provide the surface of the resin film 1 with metal palladium as nuclei for the formation of the plating, as illustrated in FIG. 1. As this metal palladium, one formed from a palladium catalyst can be used.

In the present embodiment, the adsorption of metal palladium on the surface of the resin film 1 can be enhanced by providing at least either hydroxyl groups or carboxyl groups on the surface of the resin film 1. It is hence possible to improve the adhesiveness between the resin film 1 and the electroless copper plating layer 2.

Note that whether hydroxyl groups and/or carboxyl groups are present on the interface between the resin film 1 and the electroless copper plating layer 2 can be checked by a known surface analysis method. For example, a known surface analysis method such as a Fourier-transform infrared spectroscopy (FT-IR (Fourier-transform infrared spectroscopy)), X-ray photoelectron spectroscopy (ESCA (Electron Spectroscopy for Chemical Analysis)), or TOF-SIMS can be used.

Especially in the present embodiment, as a result of an analysis by time-of-flight secondary ion mass spectroscopy (TOF-SIMS) on the side of the electroless copper plating layer 2, the peak intensity at m/z 121 is preferably 800 (0.12 amu bin) or higher at the interface between the resin film 1 and the electroless copper plating layer 2.

In other words, on the basis of the result of the analysis by TOF-SIMS, it is preferred that functional groups which have m/z 121 and contain hydroxyl groups and/or carboxyl groups be present on the interface between the resin film 1 and the electroless copper plating layer 2 in the present embodiment. Note that the functional groups of m/z 121 preferably have one of the following structural formula 1 or structural formula 2, with the structural formula 1 being particularly preferred.

<Structural formula 1>

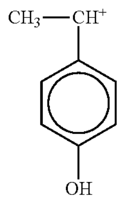

<Structural formula 2>

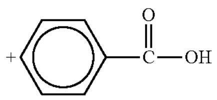

Note that "the functional groups containing hydroxyl groups and/or carboxyl groups" provided on the interface between the resin film 1 and the electroless copper plating layer 2 are not limited to those mentioned above. Further, "functional groups containing carboxyl groups" need not be provided if "functional groups containing hydroxyl groups" are provided, or the other way around. Further, "functional groups containing hydroxyl groups" and "functional groups containing carboxyl groups" may be both provided.

Especially in the present embodiment, it is preferred that "functional groups containing hydroxyl groups" be provided more than "functional groups containing carboxyl groups" on the interface between the resin film 1 and the electroless copper plating layer 2. As an alternative, preferred is a state in which "functional groups containing hydroxyl groups" are provided but "functional groups containing carboxyl groups" are not provided.

Figure 4:
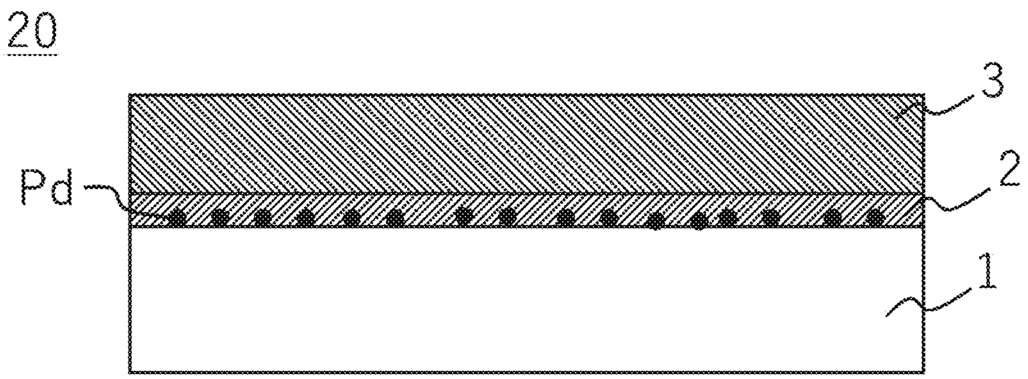
FIG. 4 is a schematic cross-sectional view illustrating a copper clad laminate 20 of the embodiment.

The copper clad laminate of the present embodiment may be a copper clad laminate 20 in which an electrolytic copper plating layer 3 is further formed on the above-described electroless copper plating layer 2 as illustrated in FIG. 4. In other words, when the flexible circuit board is produced by the semi-additive process, the electrolytic copper plating layer 3 can further be formed on the electroless copper plating layer 2, which is used as a seed layer, after formation of a resist pattern.

Note that the method for forming the flexible circuit board with the use of the copper clad laminate of the present embodiment is not limited to the above-described semi-additive process, and another known process such as a full-additive process or a subtractive process can also be applied.

Figure 3:
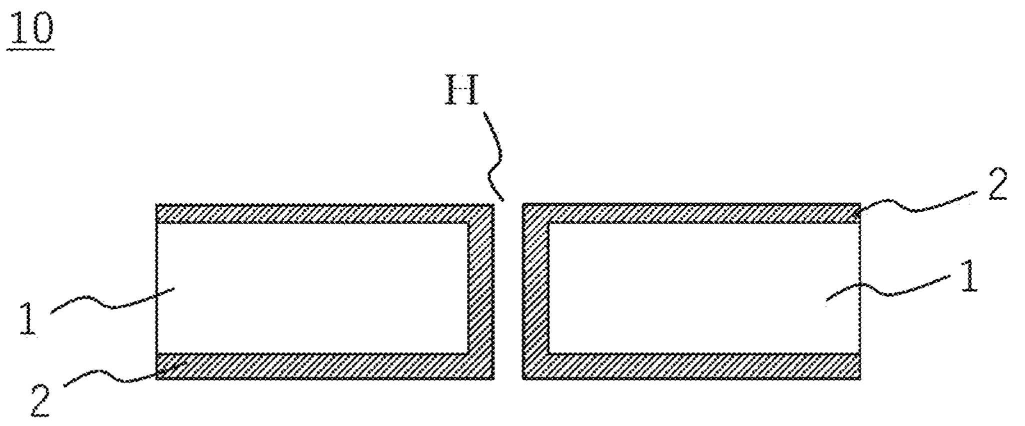
FIG. 3 is a schematic diagram illustrating a through-hole H in the copper clad laminate 10 of the embodiment.

It is also preferred that, as illustrated in FIG. 3, a through-hole H be formed in the copper clad laminate of the present embodiment after electroless copper plating layers are formed on both surfaces of the resin film. In other words, it is preferred that the resin film 1 have a through-hole in a cross-section thereof and that the through-hole H be formed such that an inner surface thereof is covered with at least portions of the electroless copper plating layers 2. The formation of such a through-hole H is preferred if the copper clad laminate of the present embodiment is used in a flexible circuit board.

Note that the detailed description regarding the position, size, and the like of the through-hole H is omitted as they can appropriately be determined depending on a flexible circuit board to be produced.

The copper clad laminate of the present embodiment includes the resin film 1 and the electroless copper plating layer 2 as described above. If there is an interval in time, for example, until the above-described formation of the electrolytic copper plating layer 3, a known protective layer (not illustrated) may further be formed on a surface of the electroless copper plating layer 2 (on a side opposite to the resin film 1) to prevent oxidation of the electroless copper plating layer 2. Note that the protective layer for the electroless copper plating layer 2 is formed by rustproofing treatment according to a known method for the purpose of the suppression of the oxidation, for example.

[Size of Crystallites in Electroless Copper Plating Layer 2]

The electroless copper plating layer 2 in the copper clad laminate of the present embodiment is characterized in that crystallites (which may hereinafter be also called "first crystallites") have a weighted average size of 25 to 300 nm. Here, the term "crystallite" means a maximum agglomerate which can be regarded as a single crystal in crystal grains. Here, the electroless copper plating layer 2 preferably has a volume resistivity of 7.0 μΩ·cm or lower.

Examples of a method for controlling, in the above-described range, the weighted average size of the crystallites in the electroless copper plating layer 2 include a method for applying heat (annealing) treatment under predetermined conditions to the electroless copper plating layer 2 formed on the resin film 1. Here, the heat (annealing) treatment to the electroless copper plating layer 2 is also characterized in that it is applied after the formation of the electroless copper plating layer 2 but before the formation of resist patterning to be described below. Note that a description will be made subsequently herein regarding a specific method of the heat (annealing) treatment.

A detailed description will hereinafter be made regarding the reasons for which the weighted average size of the crystallites in the electroless copper plating layer 2 is set to 25 to 300 nm in the present embodiment.

Described specifically, if an FPC is produced by the above-described SAP, a target circuit is formed by resist patterning (formation (coating application or bonding) of a resist, exposure, patterning), electrolytic copper plating, removal of the patterned resist, and etching of an electroless copper plating layer. Here, L/S (line and space) forming a circuit pattern is foreseen to use a narrower pitch range for the purpose of improving its performance. It is therefore important how precisely the circuit pattern is formed.

In the current SAP, after the formation of the electroless copper plating layer 2 as a seed plating layer, the above-described circuit pattern is defined with the resist on the electroless copper plating layer 2, and the electrolytic copper plating layer is then formed. If heat (annealing) treatment is applied to the electrolytic copper plating layer at this time for the purpose of releasing internal stress of the electroless copper plating layer or for a like purpose, the resist will be hardened by the heat treatment, thereby impeding the subsequent resist removal.

On the other hand, no heat treatment can be applied after the formation of the electrolytic copper plating layer as mentioned above. There is hence a concern that the adhesion strength of the electrolytic copper plating is low and that the copper plating pattern may peel off upon removal of the resist.

Apart from the above-described problem, an FPC also requires good high-frequency characteristics following evolution of high-frequency equipment. Concerning a copper plating as a conductive film, a decrease of volume resistivity can also be foreseen to be essential.

As a result of a further diligent study by the present inventors, it has come to a conclusion to improve the volume resistivity of the electroless copper plating layer 2 with good adhesiveness ensured between the whole conductive film (the electroless copper plating layer 2 and electrolytic copper plating layer 3) and the low dielectric resin film, by applying the above-described heat (annealing) treatment before the above-described resist patterning step to control the size of the crystallites in the electroless copper plating layer 2.

Described more specifically, the heat (annealing) treatment is applied under any one of the following conditions after the formation of the electroless copper plating layer 2 on the resin film 1, whereby Cu crystals which are in a fine state after the electroless copper plating are caused to grow into crystallites having a weighted average size of 25 to 300 nm. Note that the weighted average size of the crystallites in the electroless copper plating layer 2 in the present embodiment is preferably 25 to 100 nm, more preferably 25 to 65 nm. As a consequence, the difference in the weighted average size of crystallites between the electroless copper plating layer 2 and the electrolytic copper plating layer 3 becomes small, elongation characteristics of the electroless copper plating layer 2 in a plane direction are improved, and the electroless copper plating layer 2 can also retain high peel strength.

In the present embodiment, it is preferred to further form the electrolytic copper plating layer 3, which is illustrated in FIG. 4, etc., on the above-described electroless copper plating layer 2. Note that the electrolytic copper plating layer 3 is preferably formed by electrolytic plating.

In the electrolytic copper plating layer 3 laminated on the electroless copper plating layer 2, the weighted average size of Cu crystallites (which may also be called "second crystallites") in the electrolytic copper plating layer is preferably 40 to 300 nm.

Further, in the copper clad laminate of the present embodiment, the ratio of the weighted average size of the above-described second crystallites to the weighted average size of the first crystallites (the weighted average size of the second crystallites/the weighted average size of the first crystallites) is preferably 2.0 or smaller, more preferably 1.8 or smaller. The difference in size between the second crystallites and the first crystallites thus becomes small to lead to a decrease in lattice misfit, so that good adhesion strength can be assured.

The volume resistivity of the electrolytic copper plating layer 3 at this time is preferably 5.0 μΩ·cm or lower.

Note that the weighted average size of the crystallites in the electrolytic copper plating layer 3 may preferably be 40 to 100 nm, more preferably 40 to 80 nm.

Further, in the above-described range of the weighted average size of the crystallites in the electrolytic copper plating layer 3, it is possible to assure high adhesiveness with the low dielectric film while suppressing transmission loss even if the above-described ratio of the weighted average size of the second crystallites to the weighted average size of the first crystallites (the weighted average size of second crystallites/the weighted average size of first crystallites) is limited to 2.0 or smaller. Thus, a good volume resistivity can be achieved.

<Calculation Method of Weighted Average Size of Crystallites>

The sizes of the Cu crystallites (first crystallites and second crystallites) in the present embodiment are determined from peak half widths by X-ray diffraction with the use of the following equation. Measurements of X-ray diffractions are made, for example, using a known X-ray diffractometer. The crystallite sizes can each be determined by weighted-averaging peaks of copper which appear at 2θ=43 to 46 degrees, for planes ((111) plane, (200) plane, (220) plane, and (311) plane) defined by Miller indices. Note that, as specific 2θ angles, 43.3 degrees are set for the (111) plane, 50.5 degrees are set for the (200) plane, 74.1 degrees are set for the (220) plane, and 90.0 degrees are set for the (311) plane.

$$D=K\times\lambda/(\beta\times\cos\theta)$$

D: Crystallite diameter

K: Scherrer constant (K=0.94 is used herein)

λ: Wavelength of used X-ray

β: Peak half widths by X-ray diffraction of crystallites

θ: Bragg angle

After the calculation of the crystallite size of copper for each orientation plane defined by the Miller indices as described above, the size (weighted average size) of the crystallites in the copper plating layer is calculated using a weighted average as follows.

Described specifically, upon determination of each weighted average size of the crystallites in the present embodiment, the peak intensities for the respective orientation planes are first integrated, and a value obtained by dividing the integrated value by the number of the orientation planes (four in the present embodiment) is determined as an orientation rate.

In addition, the sizes of the crystallites in the respective orientation planes as obtained by the X-ray diffraction measurement and the corresponding orientation rate are multiplied together. Four crystallite sizes obtained by the multiplication with the orientation rate taken into consideration are averaged. The resulting average value is determined as "the weighted average size of the crystallites."

<Production Method of Copper Clad Laminate>

Using FIG. 5, a description will next be made regarding a production method of the present embodiment for the copper clad laminate 10.

The production method of the present embodiment for the copper clad laminate 10 includes a first surface modification step (step 1) of providing carboxyl groups and/or hydroxyl groups on at least one surface of the resin film 1, a second surface modification step (step 2) of applying, by a wet process, electric charges to the surface which has been provided with the carboxyl groups and/or hydroxyl groups, a catalyst adsorption step (step 3) of causing a catalyst to be adsorbed on the surface to which the electric charges have been applied, an electroless copper plating step (step 4) of forming the electroless copper plating layer 2 on the surface on which the catalyst has been adsorbed, and a heating (annealing) step (step 5) of heating the copper clad laminate in which the electroless copper plating layer has been formed.

Note that, as will be mentioned later, the second surface modification step in step 2 is not essential and may be omitted as desired according to the material of the resin film 1, the molar ratio in the first surface modification step, and/or the like.

Further, a production method of the present embodiment for the copper clad laminate 20 includes a step of forming an electrolytic copper plating layer, and may include a resist patterning step (step 6) of forming the resist on the electroless copper plating layer after the heating (annealing) step (step 5) in which the copper clad laminate with the electroless copper plating layer formed therein is heated, an electrolytic copper plating step (step 7) of forming the electrolytic copper plating layer 3 between portions of the patterned resist, a resist removing step (step 8) of removing the patterned resist, and a flash etching step (step 9) of etching the electroless copper plating layer after the removal of the resist.

Note that the production method of the present embodiment for the copper clad laminate may omit step 2 and step 6 to step 9 as desired. If this is the case, according to a required specification for the copper clad laminate 10 or the copper clad laminate 20, only the second surface modification step in step 2 may be omitted, step 2 may be omitted with step 6 to step 9 remained to be included, or step 2 and step 6 to step 9 may be omitted, for example. As an example, the above-described second surface modification step is desirably performed, for example, if the resin film 1 that constitutes the copper clad laminate is an LCP (Liquid Crystal Polymer), but the second surface modification step may be omitted if the resin film 1 is an MPI or a PI.

In other words, the production method of the copper clad laminate 10 in the present invention includes at least the electroless copper plating step of forming the electroless copper plating layer 2 on at least one surface of the resin film 1, and the heating (annealing) step of heating the copper clad laminate, in which the electroless copper plating layer has been formed, before the resist patterning step.

Figure 5:
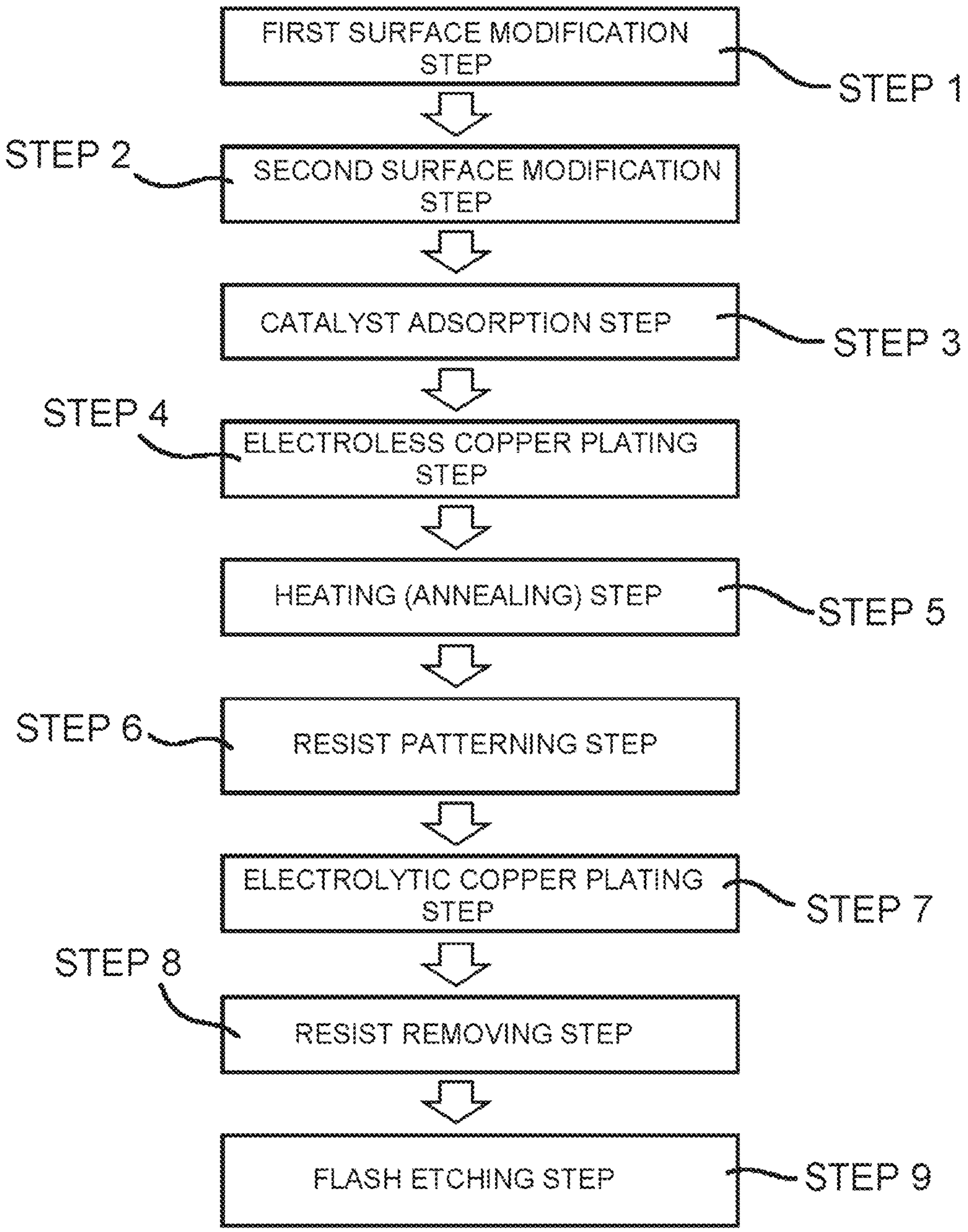
FIG. 5 is a flow chart illustrating a production method of the copper clad laminate 10, the copper clad laminate 20, and a flexible circuit board of the embodiment.

Referring also to FIG. 5 as needed, a detailed description of the individual steps will hereinafter be made.

First, the first surface modification step (step 1) is described. The resin film 1 to be used is preferably what is called a low dielectric resin film as mentioned above. As specific electrical characteristics of the resin film 1, the relative permittivity is preferably 3.5 or lower, while the dissipation factor is preferably 0.008 or lower, at a frequency of 10 GHz.

In the first surface modification step in the present embodiment, carboxyl groups and/or hydroxyl groups are provided on at least one surface of the resin film 1. Examples of a method for providing these carboxyl groups and/or hydroxyl groups include a method for bringing a liquid mixture of an aqueous alkali solution and amino alcohol into contact with the at least one surface of the resin film 1.

The aqueous alkali solution for use in the first surface modification step may be either an inorganic alkali or an organic alkali. Examples of the inorganic alkali include alkali metal hydroxides such as sodium hydroxide and potassium hydroxide, or their carbonates and the like. Examples of the organic alkali include tetraalkylammonium hydroxides and the like.

The above-described alkalis may be used singly or in combination of two or more of them.

On the other hand, the amino alcohol for use in the first surface modification step may specifically be an aliphatic amino alcohol or an aromatic amino alcohol. The amino alcohols may also be their derivatives.

Described specifically, ethanolamine, heptaminol, isoetharine, butanolamine, propanolamine, sphingosine, methanolamine, dimethylethanolamine, N-methylethanolamine, or the like can be used as the amino alcohol. Among these, the use of aminoethanol is particularly preferred.

The mixing ratio in the mixed solution of the aqueous alkali solution and the amino alcohol in the first surface modification step may preferably be adjusted such that the ratio of $—NH_2$ groups to —OH groups ($—NH_2$ groups/—OH groups) ranges from 2.00 to 3.00 in terms of molar ratio.

With the molar ratio set in the above-described range, a reduction of roughness (a further reduction in transmission loss) and adhesiveness between the electroless copper plating layer 2 and the resin film 1 can both be achieved as intended in the present invention. Its reason has not been elucidated at present, but as a result of a study by the present inventors, it is presumably attributed to the following reason.

Described specifically, if the first surface modification step is performed, with the liquid mixture having the molar ratio of ($—NH_2$ groups/—OH groups) in the above-described range, on the resin film 1 including the above-described resin of low dielectric loss (such as a liquid crystal polymer or a modified polyimide resin), it is considered that the surface of the resin film 1 on the side of the electroless copper plating layer 2 can have the average surface roughness Ra of 1 to 150 nm. If wiring conductors are formed by the electroless copper plating layer on a circuit board, it is therefore possible to suppress a transmission loss by the skin effect and to exhibit preferred transmission characteristics.

In addition, it is also possible to assure the adhesiveness between the resin film 1 and the electroless copper plating layer 2 insofar as the average surface roughness Ra of the surface of the resin film 1 on the side of the electroless copper plating layer 2 falls in the range of 1 to 150 nm.

The present inventors therefore conceived to achieve the objects of the present invention by way of the first surface modification step mentioned above.

Note that, in the first surface modification step, hydroxyl groups can be provided more than carboxyl groups on the surface of the resin film 1 by setting the molar ratio of ($—NH_2$ groups/—OH groups) in the above-described range in the mixed solution.

As a method for bringing the mixed solution of the aqueous alkali solution and the amino alcohol into contact with the surface of the resin film 1 in the first surface modification step, a known method can appropriately be used. Examples of such a known method include a method for dipping the resin film 1 in the mixed solution and a method for spraying the mixed solution to the resin film 1 by a spray device or the like. However, the known method is not limited to these methods, and a method other than those described above may be used insofar as carboxyl groups and/or hydroxyl groups can be provided on the surface of the resin film 1.

Note that, in the above-described first surface modification step, the deposition properties of the plating and the adhesiveness of the plating can be improved by adjusting the contact angle on the film surface. Especially if the resin film 1 includes a liquid crystal polymer, the contact angle is preferably 30° or smaller on the plating-layer-side interface where the resin film 1 is in contact with the electroless copper plating layer 2. Also, especially if the resin film 1 is an MPI, the contact angle is preferably 45° or smaller on the plating-layer-side interface where the resin film 1 is in contact with the electroless copper plating layer 2.

Next, a description will be made regarding the second surface modification step (step 2) in the present embodiment. The second surface modification step in the present embodiment is preferably performed after the above-described first surface modification step. In other words, the second surface modification step is not necessarily performed after the first surface modification step, and as mentioned above, the second surface modification step in step 2 can be omitted as desired.

Such a second surface modification step is a step of, after the provision of the carboxyl groups and/or hydroxyl groups onto the surface of the resin film 1 in the above-described first surface modification step, further applying electric charges to the surface. The inclusion of the second surface modification step is preferred as the adhesiveness between the resin film 1 and the electroless copper plating layer 2 can be improved by the application of electric charges.

Described specifically, in order to form the electroless copper plating layer 2, it is preferred that metal palladium which acts as nuclei for the growth of the plating be present on the resin film 1 as mentioned above. Further, in order to firmly deposit metal palladium on the resin film 1, it is preferred that the surface of the resin film 1 have at least negative charges.

Preferably, the second surface modification step in the present embodiment further includes a step of applying positive charges onto the surface of the resin film 1, and a step of further applying negative charges to the surface to which the positive charges have been applied. When these steps are performed on the resin film 1, it becomes possible to ensure the deposition of negative charges on the surface of the resin film 1. Therefore, the inclusion of these steps is preferred from viewpoints of the above-described deposition of metal palladium and adhesiveness of the electroless copper plating layer 2.

In the above-described step of applying positive charges onto the surface of the resin film 1, it is possible to employ, as a specific method, a method for further dipping, in a known cationic surfactant, the resin film 1 the surface of which carboxyl groups and/or hydroxyl groups have been provided, a method for bringing a known cationic surfactant into contact with the resin film 1 by spraying, or a like method.

In the step of causing negative charges to be adsorbed on the surface of the resin film 1, it is also possible to similarly employ a method for dipping the resin film 1 in a known anionic surfactant or such a method as spraying.

Note that the second surface modification step in the present embodiment is preferably performed by a wet process as mentioned above. The performance by the wet process is suited for mass production by reel-to-reel or the like, and also has a merit that a cost reduction is possible.

Next, a description will be made regarding the catalyst adsorption step (step 3) in the production method of the present embodiment.

The catalyst adsorption step in the present embodiment is a step of causing a catalyst to be adsorbed further on the surface of the resin film 1 to which at least negative charges have been applied in the above-mentioned second surface modification step.

As a method for causing the catalyst to be adsorbed further on the surface of the resin film 1 in the catalyst adsorption step, the adsorption can be performed, for example, by bringing a known catalyst solution into contact with the surface of the resin film 1 by a known method. As the catalyst, Cu, Ni, Pd, Ag, or the like can be used. Usable examples of the known catalyst solution include, but are not limited to, tin-palladium-based and palladium-colloid-based catalyst solutions.

The amount of the catalyst to be provided on the resin film 1 in the catalyst adsorption step is preferably 15 μg/$dm^2$ or less in terms of metal palladium. As the lower limit of the catalyst, the less the catalyst is provided, the more beneficial it is, when etching upon formation of a circuit is taken into consideration. However, the catalyst needs to be provided to such an extent that the electroless copper plating layer is formed well, and therefore, the amount of metal palladium is preferably 1 μg/$dm^2$ or more.

If the amount of metal palladium provided on the resin film 1 is more than the above-described value, the insulation reliability between circuits may decrease when a flexible circuit board includes such a resin film 1. Such a large amount of metal palladium is hence not preferred.

Note that the amount of metal palladium can be determined by a known measurement method. For example, the amount of metal palladium can be determined by such a method that, after only copper is peeled off from the resin film 1, palladium residue on the resin film 1 is dissolved with nitric acid, and the amount of the residue is then measured by ICP.

Next, a description will be made regarding the electroless plating step (step 4) in the production method of the present embodiment.

The electroless copper plating step is preferably performed after the above-described catalyst adsorption step is performed. Here, as an electroless copper plating bath in the present embodiment, a known bath such as an EDTA bath, a Roshelle salt bath, or a triethanolamine bath can be used.

By the above steps, the copper clad laminate 10 of the present embodiment is produced.

Note that the dipping time of the resin film 1 in the plating bath may appropriately be determined such that the thickness of the electroless copper plating layer 2 ranges from 0.1 to 1.0 μm.

Further, the plating layer to be formed in this electroless copper plating step is not limited to plating of a Cu simple substance and may be a copper alloy plating. The plating bath may be one that forms, for example, a Cu—Ni alloy, a Cu—Zn alloy, a Cu—Sn alloy, or the like.

As the plating bath in this case, a known plating bath can appropriately be used.

For the reasons mentioned above, the production method of the present embodiment includes the heating (annealing) step (step 5) of, after the formation of the electroless copper plating layer 2 on the resin film 1 but before the resist patterning step, heating the copper clad laminate such that the weighted average size of the crystallites in the electroless copper plating layer 2 becomes 25 to 300 nm. Note that this heating (annealing) step in step 5 may be performed for the purpose of not only causing a transformation of structure as described above, but also releasing internal stress of the electroless copper plating layer (aging purpose), for example.

As heating conditions for the heating (annealing) step described above, the heating (annealing) is preferably conducted, for example, under the following heating conditions such that the weighted average size of the crystallites in the electroless copper plating layer 2 ranges from 25 to 300 nm.

<Typical Heating Conditions>

Heating temperature: 150° C. to 350° C.

Heating (soaking) time: 5 to 180 minutes

Atmosphere: in the atmosphere or in an inert gas (nitrogen or the like)

Note that the above-described atmosphere may be in the atmosphere, in an inert gas, or in a vacuum, and as the kind of the inert gas, nitrogen gas, mixed gas of hydrogen and nitrogen, argon gas, helium gas, or the like can be used. From a viewpoint of equipment cost, preferred is in the atmosphere or in an inert gas. As the heating atmosphere, an inert gas atmosphere or a vacuum is more preferred to suppress the formation of an oxide film.

As the particularly preferred ranges of the heating time and temperature when the heat (annealing) treatment is applied in the atmosphere, a heating temperature of 180° C. to 200° C. and a heating (soaking) time of 10 to 60 minutes are preferred to suppress the formation of the oxide film. As the particularly preferred ranges of the heating time and temperature in the inert gas atmosphere, on the other hand, a heating temperature of 220° C. to 350° C. and a heating (soaking) time of 10 to 180 minutes are preferred.

By the heating (annealing) step, crystallites of Cu which are in a fine state after the electroless copper plating can grow and coarsen. Note that the weighted average size of the Cu crystallites (first crystallites) in the electroless copper plating layer 2 and the weighted average size of the Cu crystallites (second crystallites) in the electrolytic copper plating layer 3 in the electrolytic copper plating step as the post step are preferably based on the above-described ratio.

As a consequence, the elongation characteristics of the electroless copper plating layer 2 are improved, so that high peel strength can also be retained.

Moreover, by the heating (annealing) step, the peeling of the electroless copper plating layer 2 from the resin film 1 can be suppressed, so that adhesiveness between the electroless copper plating layer 2 and the resin film 1 can also be assured.

After the heating (annealing) step in step 5 is performed, the resist is subjected to patterning (is formed (applied or bonded) and is patterned according to a desired circuit) by a known method (step 6), and the electrolytic copper plating layer 3 is formed between portions of the resist on the electroless copper plating layer 2 under the above-described electrolytic copper plating conditions (step 7). Note that the thickness of the electrolytic copper plating layer 3 is, for example, preferably 10 to 30 μm.

Here, it is preferred to satisfy at least one of the following conditions: the weighted average size of the crystallites in the electrolytic copper plating layer 3 is 40 to 300 nm; and the volume resistivity of the electrolytic copper plating layer 3 is 5.0 μΩ·cm or lower.

Note that, as the electrolytic copper plating step for the formation of the electrolytic copper plating layer 3, a known copper sulfate bath, a copper pyrophosphate bath, or the like can be used. Further, electrolytic plating conditions (pH, temperature, current density, dipping time, and so on) can appropriately be chosen on the basis of the thickness of the electrolytic copper plating layer 3 or the like.

When the above steps are performed, the copper clad laminate 20 of the present embodiment is produced.

<Flexible Circuit Board>

Next, a description will be made regarding a flexible circuit board of the present embodiment.

The flexible circuit board of the present embodiment is preferably a flexible circuit board having a circuit formed by the electroless copper plating layer 2 of the above-mentioned copper clad laminate 10.

The surface roughness Ra between the resin film 1 and the electroless copper plating layer 2 in the copper clad laminate 10 of the present embodiment has the predetermined value or smaller as mentioned above, so that a transmission loss of the flexible circuit board can be suppressed.

Further, as the adhesiveness between the resin film 1 and the electroless copper plating layer 2 can be improved, it has become possible to form a fine circuit pattern even if a semi-additive process is adopted. The use of the copper clad laminate 10 is therefore preferred. Described more specifically, if an SAP or an MSAP is used, for example, in the production method of the present embodiment for the flexible circuit board, the above-mentioned step 1 to step 5 (also see FIG. 4) are performed, and a known resist patterning step is then performed to form (apply or bond) the resist on the electroless copper plating layer 2 and to conduct patterning. After that, the above-described electrolytic copper plating step is further performed. Thus, the electrolytic copper plating layer 3 is formed between portions of the patterned resist.

Figure 6:
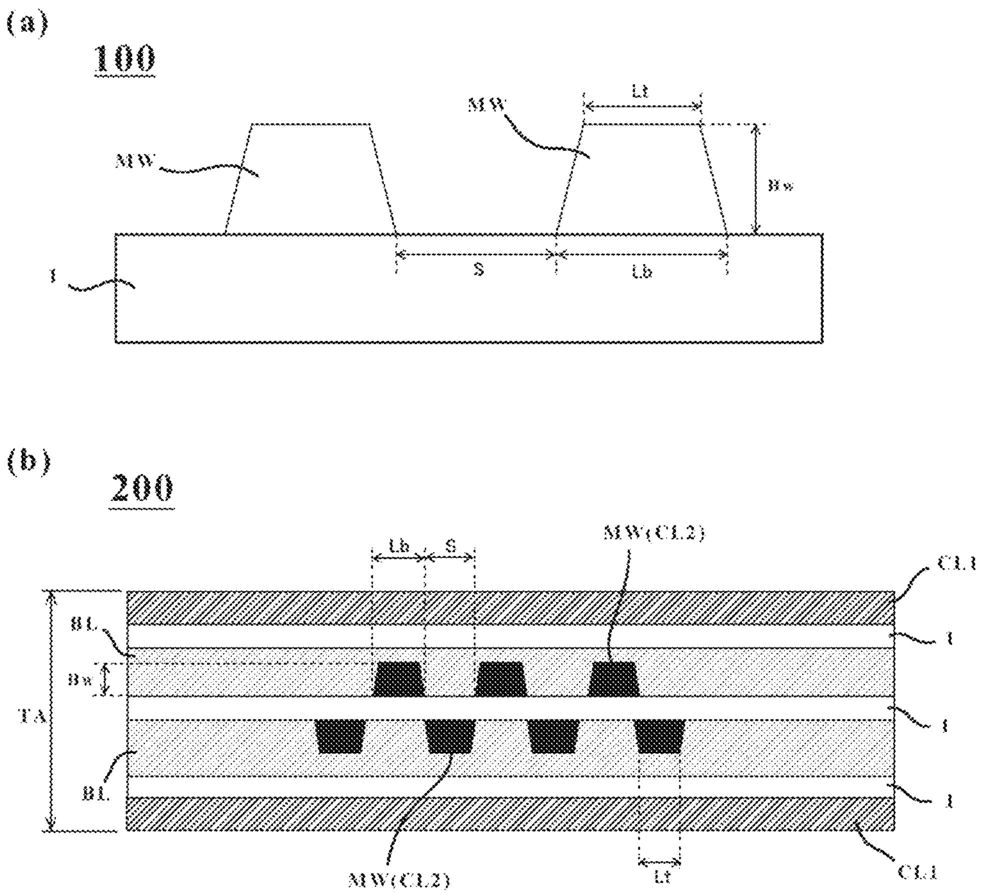
FIG. 6 illustrates schematic diagrams of a flexible circuit board 100 which has metal wires formed on the resin film 1 by the copper clad laminate 20, and a laminated flexible circuit board 200.

FIG. 6(*a*) schematically illustrates a flexible circuit board 100 using the copper clad laminate 20 of the present embodiment (in other words, the copper clad laminate in which the electrolytic copper plating layer 3 is formed further on the electroless copper plating layer 2). In the flexible circuit board 100, metal wires MW that are obtained in the present embodiment and have a specific conductor shape form at least portions of a circuit. Note that, in the flexible circuit board 100 of the present embodiment, it is sufficient to use the copper clad laminate 20 as at least some of the conductors (metal wires) included in the circuit, and metal wires may be formed as the other circuit portions by a conventional method.

Here, as illustrated in FIG. 6(*a*), supposing that the height of the metal wire MW from the resin film 1 is Hw, the width of a bottom base of the metal wire MW in contact with the resin film 1 is Lb, the width of an upper surface of the metal wire MW is Lt, and an inter-wire distance from another adjacent metal wire MW on the resin film 1 is S, the metal wire MW in the flexible circuit board 100 preferably satisfies the following equation (1).

$$A \geq 2.5 \quad (1)$$

Note that, in the present embodiment, A in the equation (1) represents the rectangularity of a conductor shape in a cross-section of the metal wire MW in a width direction that is orthogonal to a direction in which a current flows in the metal wire MW. As described above, the rectangularity A in the present embodiment is defined by a value that is obtained by dividing the height Hw of the wire by the difference between the width Lb of the bottom base and the width Lt of the upper surface.

$$\text{Rectangularity } A \text{ of conductor shape} = Hw/(Lb-Lt)$$

Further, the metal wire MW in the flexible circuit board 100 preferably satisfies the following equation (2) in addition to the above-described equation (1).

$$\text{Inter-wire distance } S \leq 60\ \mu m \quad (2)$$

Further, the metal wire MW in the flexible circuit board 100 preferably satisfies the following equation (3):

$$\text{Conductor wiring density WD} \leq 10.0 \quad (3)$$

where the conductor wiring density WD in the flexible circuit board 100 is the value (S/A) obtained by dividing the above-described inter-wire distance S by the above-described rectangularity A of the conductor shape.

Now, in order to make the above-described conductor wiring density WD high in the flexible circuit board, it is necessary to make the above-described rectangularity A of the conductor shape as close to a rectangular shape as possible, and also to make the above-described inter-wire distance S as small as possible.

Under the above-described knowledge, the present inventors conducted a diligent study, and as a result, came to a conclusion that the value of the rectangularity A of the conductor shape should preferably be 2.5 or greater, the above-described inter-wire distance S should preferably be 60 μm or smaller, and the conductor wiring density WD should preferably be 10.0 or lower. When these values are simultaneously satisfied, the rectangularity A of the conductor shape can be said to be rectangular (A≥2.5), the cross-section (conductor shape) in the width direction of each metal wire MW becomes substantially rectangular, and while the wire resistance is lowered, the acute-angle portions on the base surface side are made relatively obtuse compared with a non-rectangular shape (such as a trapezoidal shape having a relatively large bottom base). It is therefore possible to suppress a decrease in transmission loss of a high-frequency current or the like.

Further, FIG. 6(*b*) schematically illustrates a flexible circuit board 200 in which conductor layers are laminated by using a plurality of copper clad laminates 20 of the present embodiment. Described specifically, the flexible circuit board 200 of the present embodiment includes a pair of conductor layers CL1 as outermost layers, conductor layers CL2 disposed between the paired conductor layers CL1 and having the respective metal wires MW of the present embodiment formed therein, and dielectric layers such as known bonding layers BL that bond these conductor layers. In this case, the above-described conductor layers CL1 and conductor layers CL2 mean electric conductor layers disposed on the same plane respectively, and do not include vertical conductive layers where via holes and/or through holes are formed in the copper clad laminates 20.

As described above, the number of the laminated conductor layers CL is defined as the number of layers in the present embodiment. In this case, at least four or more conductor layers CL including the metal wires MW described above are laminated in the flexible circuit board 200. Here, the flexible circuit board 200 preferably has an average thickness of 50 μm or smaller. The average thickness is obtained by dividing the total thickness TA of the conductor layers CL (the distance between the outermost conductor layers) by the number of the layers of the conductor layers CL (four layers in FIG. 6(*b*)).

According to the flexible circuit board 200 of the present embodiment, it is therefore possible to make the wiring finer and thinner in the flexible circuit board, so that the thickness of dielectric layers in a multilayered wiring board can be reduced and high densification and fine patternability can be increased at the same time.

<Production Method of Flexible Circuit Board>

Next, a detailed description will be made regarding a production method of the present embodiment for the flexible circuit board 100. Hereinafter, a case in which the flexible circuit board 100 is produced by a known SAP with the use of the above-described copper clad laminates 20 will be described by way of example.

Described specifically, as the production method of the flexible circuit board 100, the copper clad laminate 10 is first formed by performing the above-mentioned steps up to step 5. The copper clad laminate 10 with the above-described electroless copper plating layer 2 (for example, an electroless Cu—Ni layer) formed therein is thus provided. At this time, as an advance process to be performed before step 1 described above, the above-described through-holes H having a diameter of, for example, approximately 70 to 100 μm may be formed in the resin film 1 as needed, and the positions and sizes of the through-holes H can be determined as desired according to the specification of the flexible board. Further, for the formation of the through-holes H, two kinds of processing, that is, drilling processing and laser processing, can be exemplified.

As the drilling processing, for example, several base materials (films) may be stacked together, and by use of a known mechanical drill at high-speed rotation, through-holes may be formed at predetermined positions. As the laser processing, on the other hand, two kinds of laser processing using a known $CO_2$ laser and a known UV-YAG laser can be exemplified. Note that, when through-holes H of small diameter are formed, laser processing is suited, with the use of the UV-YAG laser being particularly preferred.

Further, a known desmear processing may be performed after the through-holes H are formed by the above-described technique.

Next, the resist is formed (bonded or applied) by a known technique on the electroless copper plating layer 2 in the above-described copper clad laminate 10, and is subjected to patterning (step 6 described above). In the present embodiment, as an example, after a DFR (Dry Film Resist) is bonded to the above-described electroless copper plating layer 2 by a known roll laminator, a resist pattern may be formed on the electroless copper plating layer 2 by conducting known exposure processing with a mask having a wiring pattern formed therein and development processing.

Further, as such a DFR, "Sunfort" (registered trademark) manufactured by Asahi Kasei E-Materials Corporation, "Photec" (registered trademark) manufactured by Showa Denko Materials Co., Ltd., "Riston" (registered trademark) manufactured by E. I. du Pont de Nemours and Company, or the like can be used, for example. After the formation of the above-described resist pattern, it is preferred to further conduct, for example, known plasma ashing treatment (as an example, plasma processing in a mixed gas atmosphere of $CF_4$ and $O_2$) for removing resist residue.

After the formation of the above-described resist pattern on the electroless copper plating layer 2 in the copper clad laminate 10, the electrolytic copper plating layer 3 is formed on the electroless copper plating layer 2 by using a known electrolytic copper plating bath (as an example, a plating bath having the following bath composition) (step 7 described above). The thickness of the electrolytic copper plating layer 3 is, for example, preferably 10 to 30 μm.

Note that no further heat treatment is applied to that electrolytic copper plating layer 3.

<Plating Conditions for Electrolytic Copper Plating (Example)>

Bath composition:
- Copper sulfate hexahydrate: 200 g/L
- Sulfuric acid: 50 g/L
- Chloride ions: 50 ppm
- Gloss agent: 5 ml/L ("Top Lucina" (registered trademark) manufactured by Okuno Chemical Industries Co., Ltd.)

Bath temperature: 20° C. to 25° C.

Current density: 2.0 to 3.0 A/$dm^2$

After the formation of the electrolytic copper plating layer 3 with the above-described thickness on the electroless copper plating layer 2 by the above-described technique, the resist is removed by a known technique (step 8 described above). Owing to the use of the above-described DFR as a resist material in the present embodiment, it is hence possible to use, for example, any one of a known aqueous NaOH solution, amine-based stripper solution, or inorganic stripper solution for the stripping of the DFR.

After the above-described resist removing step, known flash etching is performed as a finish for each wiring pattern (step 9 described above). In such flash etching, a sulfuric acid/hydrogen peroxide solution can be used as a soft etchant, and a known processing solution such as "EVACHEM (registered trademark) FINE ETCH FE-830 (II)" or "EVACHEM (registered trademark) FINE ETCH SAC" manufactured by JCU Corporation can be used.

By performing the above-described steps, the flexible circuit board 100 with desired metal wiring patterned thereon can be produced.

The above-described flexible circuit board 200 (multilayered flexible circuit board) of the present embodiment can also be produced through lamination of a plurality of desired flexible circuit boards 100 by using known bonding layers BL for multilayered FPCs (for example, known bonding sheets having a thickness of 15 to 25 μm, such as "AU" manufactured by Arisawa Manufacturing Co., Ltd., "SAFY" manufactured by Nikkan Industries Co., Ltd., "Vecstar (registered trademark) CTF" manufactured by Kuraray Co., Ltd., or "R-BM17" manufactured by Panasonic Corporation).

Note that, as the lamination method for the flexible circuit board 100, for example, the following methods are available: a method for pressing a predetermined number of flexible boards which are stacked on top of one another, together in a vacuum while heating them to a temperature at which their film layers soften; and a method for attaching the above-described bonding sheet or sheets to one surface or both surfaces of the flexible circuit board 100 and bonding them together by hot pressing.

EXAMPLES

The present invention will next be described more specifically by giving Examples.

Example 1

First, a liquid crystal polymer film ("Vecstar CTQLCP" manufactured by Kuraray Co., Ltd., thickness: 50 μm) was prepared as a resin film 1. As its electrical characteristics, the relative permittivity at 10 GHz was 3.3, and the dissipation factor at 10 GHz was 0.002.

As the first surface modification step, the prepared resin film 1 was next dipped for five minutes in a mixed solution of an aqueous solution of potassium hydroxide and monoethanolamine to introduce carboxyl groups and/or hydroxyl groups to both surfaces of the resin film 1, followed by dip rinsing in water. The temperature of the used mixed solution was 40° C., and the molar ratio of —$NH_2$ groups to —OH groups (—$NH_2$ groups/—OH groups) was 2.29. In addition, the peak intensity at m/z 121 by TOF-SIMS was 1000.

As the second surface modification step, the resin film 1 was dipped for two minutes in a 10 g/L solution of a cationic surfactant to cause positive charges to be adsorbed on the both surfaces of the resin film 1. After dip rinsing in water, the resin film 1 was dipped for one minute in a 3 g/L aqueous solution of an anionic surfactant. As described above, negative charges were caused to be adsorbed on the surfaces after the adsorption of positive charges.

As the catalyst adsorption step and the electroless copper plating step, the resin film 1 was further dipped for five minutes in an aqueous solution of palladium chloride ($PdCl_2$) as a plating catalyst (2 g/L, pH 12, 40° C.), followed by dip rinsing in water. The resin film 1 was further dipped for five minutes in an aqueous solution (25° C.) in which 1 g/L of dimethylaminoborane (DMAB) and 6 g/L of boric acid had been added as catalyst activators (reducing agents), followed by dip rinsing in water.

Subsequently, an electroless Cu—Ni plating layer was formed to 0.2 μm in an electroless plating bath. Electroless plating conditions were set as follows.

[Electroless Plating Conditions]

Bath composition:
- Copper sulfate: 7.5 g/L
- Nickel sulfate: 0.7 g/L
- Rochelle salt: 20 g/L
- Sodium hydroxide: 5 g/L pH: 9

Bath temperature: 32° C.

[Heat (Annealing) Treatment]

In this Example, after the formation of an electroless copper plating layer 2, heat treatment was applied under the following conditions by using a vacuum dryer ("DQ-46P-LP" manufactured by SATO VAC INC.).

<Heating Conditions>

Heating temperature: 290° C.

Heating (soaking) time: 10 minutes

Heating atmosphere: inert gas ($N_2$ gas)

Note that the content of Ni in the resulting electroless Cu—Ni plating layer was determined by a method to be described later using a plasma emission spectrometer (ICP) and was found to be 1.18 wt %. Further, the weighted average size of crystallites in the resulting electroless Cu—Ni plating layer 2 was 33.4 nm.

In the above-described copper clad laminate 10, an electrolytic copper plating layer 3 was then formed on the electroless copper plating layer 2 in the following electrolytic plating bath to obtain a copper clad laminate 20.

Electrolytic copper plating conditions were set as follows.

Bath composition:
- Copper sulfate hexahydrate: 200 g/L
- Sulfuric acid: 50 g/L
- Chloride ions: 50 ppm
- Gloss agent: 5 ml/L ("Top Lucina" (registered trademark) manufactured by Okuno Chemical Industries Co., Ltd.)

Bath temperature: 20° C. to 25° C.

Current density: 2 to 3 A/$dm^2$ (in this Example, 2.5 A/$dm^2$)

pH: lower than 1

Note that the thickness of the resulting electrolytic copper plating layer was 18 μm. Further, the weighted average size of crystallites in the resulting electrolytic copper plating layer 3 was 53.0 nm. At this time, assuming that the weighted average size of the crystallites in the electroless copper plating layer was first crystallites and that the weighted average size of the crystallites in the electrolytic copper plating layer was second crystallites, a ratio of the weighted average size of the second crystallites to the first crystallites (the weighted average size of the second crystallites/the weighted average size of the first crystallites) was 1.59.

[Evaluation]

<Measurement of Crystallite Sizes and Calculation of Weighted Average Size>

After the formation of the electroless copper plating layer, heat treatment was applied under the conditions illustrated in Table 1, and the resulting copper clad laminate 10 was measured using an X-ray diffractometer ("SmartLab" manufactured by Rigaku Corporation). Subsequent to this measurement, the weighted average size was calculated according to the above-described <Calculation method of weighted average size of crystallites>.

<Measurement of Ni Content in Electroless Copper Plating Layer 2>

After the formation of the electroless copper plating layer under the conditions illustrated in Table 1, a 2 cm×2 cm region of the electroless copper plating layer was dipped in 30% nitric acid (room temperature) to dissolve the electroless copper plating layer. Then, the resulting solution was measured for the weights of Cu (copper) and Ni (nickel) by using a plasma emission spectrometer (ICP) ("ICPE-9820" manufactured by Shimadzu Corporation), and the Ni weight/(Cu weight+Ni weight) was calculated to obtain the Ni content of the electroless copper plating layer 2.

<TOF-SIMS and ESCA>

To check whether carboxyl groups and/or hydroxyl groups are present on the interface between the resin film 1 and the electroless copper plating layer 2, ascertainment of surface conditions was made.

The resulting copper clad laminate 10 was first dipped in a 42 Baume solution of $FeCl_3$ (50° C.) without the heat treatment. At a timing that elimination of the electroless copper plating layer 2 had been confirmed by visual observation, the copper clad laminate 10 was pulled out, whereby the electroless copper plating layer 2 was peeled off, and the resin film was exposed. The exposed resin film surface was cut out in a size of 20 mm×20 mm and used as a measurement sample. The measurement sample was measured by an X-ray photoelectron spectroanalyzer (manufactured by JEOL, Ltd., "JPS-9200," X-ray source: Mg, analysis range: 3 mm in diameter), and a C1s spectrum was obtained. The intensity of a peak originating from carboxyl groups (COO(H) bonds) and appeared at a binding energy of 288.8 eV and the intensity of a peak originating from C—C bonds and appeared at a binding energy of 284.7 eV were calculated.

According to the results of the above-described measurement by ESCA, it was unable to confirm the presence of carboxyl groups. Surface conditions of the above-described measurement sample were next checked by TOF-SIMS.

The surface of the above-described measurement sample was analyzed by a "TOF-SIMS TRIET-II" (manufactured by ULVAC-PHI, INCORPORATED). As a control, on the other hand, an untreated resin film sample was used. Measurement conditions were as follows.

Primary ions: $^{69}Ga$

Accelerating voltage: 15 kV

Measurement range: 100 μm×100 μm

Mass range: 0.5 to 300 (m/z)

The results thus obtained were analyzed by an analysis software "Win Cadence" (created by Physical Electronics Inc.). It was confirmed that, in a TOF-SIMS spectrum, a peak characteristic to m/z 121 was observed only from the surface of the sample from which the electroless copper plating had been peeled. No peak characteristic to m/z 121 was observed from the untreated sample surface.

According to the measurement results by ESCA, $C_8H_9O$ ($-CH-CH_3-C_6H_4-OH$) groups were determined to have been introduced after the application of the first surface modification step and second surface modification step, as it was unable to confirm the presence of carboxyl groups.

<Ra after Peeling of Plating Layer>

Using an $FeCl_3$ solution for the resulting copper clad laminate 10 (thickness of the electroless copper plating layer: as illustrated in Table 1), the electroless copper plating layer 2 was peeled off to have the resin film exposed. The surface roughness (Ra) of the exposed resin film was measured by a laser microscope ("Olympus OLS3500") in an AFM (Atomic Force Microscopy) mode at a viewing angle of 5 μm×5 μm. The value thus obtained is illustrated in Table 2.

<Contact Angle>

Using the $FeCl_3$ solution for the resulting copper clad laminate 10 in a similar manner as mentioned above, the electroless copper plating layer 2 was peeled off to have the resin film exposed. The exposed resin film surface was cut out in 20 mm×20 mm and used as a measurement sample. Pure water (2.0 μL) was dropped to the surface of the sample, and the contact angle was measured by a contact angle meter ("DropMaster" manufactured by Kyowa Interface Science Co., Ltd.). Note that the contact angle on the surface of the untreated resin used in Example 1 was 65°, and the contact angle on the surface of an untreated resin used in Example 14 was 58°.

<Tape Peel Strength>

In the copper clad laminate 10 with the electroless copper plating layer 2 formed therein (thickness of the electroless copper plating layer: as illustrated in Table 1), after an adhesive tape (manufactured by NICHIBAN Co., Ltd.) was bonded to the surface of the electroless copper plating layer 2, the adhesive tape was pulled off therefrom to conduct a tape peeling test. When no peeling of the electroless copper plating layer 2 was confirmed by visual observation, the evaluation result was ranked "○." The result is illustrated in Table 2.

<90° Peel Strength>

From the copper clad laminate 20 with the electrolytic copper plating layer 3 formed therein, specimens of 40 mm×40 mm size were cut out, and the cut-out specimens were each bonded to an aluminum plate by a polyimide tape. As the adhesion strength between the resin film and the electroless copper plating layer, the 90° peel strength was measured as will be described hereinafter.

Described specifically, cuts were made by a cutter at intervals of 5 mm in the surface on which the electrolytic copper plating layer was formed, that is, the copper plating surface of each specimen, to form strips. Each strip was next forced to peel off at an end portion thereof to crease a start point for peeling, so that a peeled portion of the resin film and the copper plating layer was formed. The peeled portion of the resin film and the copper plating layer was then held by a chuck of a Tensilon tensile tester, and its 90° peel strength was measured by an autograph. Note that the 90° peel strength was converted to N/cm (width). These results are illustrated in Table 2.

<Plating Quality (External Appearance Test)>

With respect to the resulting copper clad laminate 10, the appearance of its electroless copper plating layer was visually observed, and one having neither peeling nor blistering is illustrated as "○" in Table 2.

<Volume Resistivity>

The volume resistivity (μΩ·cm) of the resulting copper clad laminate 10 was measured by the four-point probe method using a "Loresta-GP" ("MCP-T600" manufactured by Mitsubishi Chemical Corporation). The measurement result of this volume resistivity is illustrated in Table 2.

<Comprehensive Evaluation>

The above-described evaluation items were comprehensively checked, and those which had no problem in practical use and those which could not be practically used are illustrated as "○" and "x," respectively, in Table 2.

Example 2

The procedures of Example 1 were similarly followed except that the heating temperature in the heating (annealing) step was changed to 280° C. The results are illustrated in Table 1 and Table 2.

Example 3

The procedures of Example 1 were similarly followed except that the heating temperature in the heating (annealing) step was changed to 270° C. The results are illustrated in Table 1 and Table 2.

Example 4

The procedures of Example 1 were similarly followed except that the heating temperature in the heating (annealing) step was changed to 260° C. and that the plating thickness of the electroless Cu—Ni plating layer 2 was also changed to 0.1, 0.2, and 0.3 μm, separately. The results are illustrated in Table 1 and Table 2.

Example 5

The procedures of Example 1 were similarly followed except that the heating temperature in the heating (annealing) step was changed to 250° C. The results are illustrated in Table 1 and Table 2.

Example 6

The procedures of Example 5 were similarly followed except that the heating (soaking) time in the heating (annealing) step was changed to 30 minutes. The results are illustrated in Table 1 and Table 2.

Example 7

The procedures of Example 5 were similarly followed except that the heating (soaking) time in the heating (annealing) step was changed to 60 minutes. The results are illustrated in Table 1 and Table 2.

Example 8

The procedures of Example 5 were similarly followed except that the heating (soaking) time in the heating (annealing) step was changed to 120 minutes. The results are illustrated in Table 1 and Table 2.

Example 9

The procedures of Example 5 were similarly followed except that the heating (soaking) time in the heating (annealing) step was changed to 180 minutes. The results are illustrated in Table 1 and Table 2.

Example 10

The procedures of Example 1 were similarly followed except that the heating temperature in the heating (annealing) step was changed to 220° C. and that the plating thickness of the electroless Cu—Ni plating layer 2 was also changed to 0.1, 0.2, and 0.3 μm, separately. The results are illustrated in Table 1 and Table 2.

Example 11

The procedures of Example 10 were similarly followed except that the plating thickness of the electroless Cu—Ni plating layer 2 was changed to 0.2 μm and that the heating (soaking) time in the heating (annealing) step was changed to 60 minutes. The results are illustrated in Table 1 and Table 2.

Example 12

The procedures of Example 10 were similarly followed except that the plating thickness of the electroless Cu—Ni plating layer 2 was changed to 0.2 μm and that the heating (soaking) time in the heating (annealing) step was changed to 180 minutes. The results are illustrated in Table 1 and Table 2.

Example 13

The procedures of Example 1 were similarly followed except that the heating temperature in the heating (annealing) step was changed to 200° C. and that the heating atmosphere was changed to the atmosphere using a dry oven ("DY 300" manufactured by Yamato Scientific Co., Ltd.). The results are illustrated in Table 1 and Table 2.

Example 14

The procedures of Example 13 were similarly followed except that the resin film 1 was changed to an MPI, that the pH and the plating thickness of the electroless Cu—Ni plating layer 2 in the electroless copper plating conditions were changed to 12.5 and 0.3 μm, and that the heating temperature and heating (soaking) time in the heating (annealing) step were changed to 150° C. and 60 minutes. Note that, as the MPI, "FS-L" manufactured by SKC KOLON PI Inc. (thickness: 50 μm) was used. As electrical characteristics of the resin film 1, the relative permittivity at 10 GHz was 3.4, and the dissipation factor at 10 GHz was 0.0035. The results are illustrated in Table 1 and Table 2.

Example 15

The procedures of Example 13 were similarly followed except that the resin film 1 was changed to an MPI, that a surface-modifying mixed solution was prepared in the first surface modification step by mixing water (60 vol %) with a mixed solution (40 vol %) of an aqueous solution of potassium hydroxide and monoethanolamine, that the second surface modification step was omitted, that the plating thickness of the electroless Cu—Ni plating layer 2 was changed to 0.3 μm, and that the heating temperature, heating (soaking) time, and heating atmosphere in the heating (annealing) step were changed to 220° C., 30 minutes, and an inert gas ($N_2$ gas). Note that, as the MPI, "FS-L" manufactured by SKC KOLON PI Inc. (thickness: 50 μm) was used. As electrical characteristics of the resin film 1, the relative permittivity at 10 GHz was 3.4, and the dissipation factor at 10 GHz was 0.0035. The results are illustrated in Table 1 and Table 2.

Example 16

The procedures of Example 15 were similarly followed except that the heating temperature and heating (soaking) time in the heating (annealing) step were changed to 300° C. and 60 minutes. The results are illustrated in Table 1 and Table 2.

Example 17

As an FCCL (Flexible Copper Clad Laminate), the copper clad laminate 20 produced above in Example 9 was used.

To the copper clad laminate 20, a known DFR was bonded by a known roll laminator. The resist was then exposed by a known exposure system to ultraviolet rays through a mask in which a predetermined resist pattern image was formed, whereby negative portions in the resist were cured.

Unexposed portions in the resist were then dissolved and removed with a known alkaline developer solution such as a 1 mass % aqueous solution of sodium carbonate as a developer solution to form a resist pattern on the electroless copper plating layer. After the formation of the above-described resist pattern, plasma processing was performed in a known mixed gas atmosphere of $CF_4$ and $O_2$ to remove resist residue.

The FCCL of this Example, which had been obtained above and had the resist pattern formed thereon, was then pickled by dipping it at 30° C. for exactly 30 seconds in a 5 wt % solution of sulfuric acid before electrolytic plating, whereby an oxide film on the electroless copper plating layer was removed.

An electrolytic copper plating was then formed on the electroless copper plating layer, which had the resist pattern formed thereon, under the following plating conditions such that a predetermined height Hw of the wire described in Table 3 was obtained.

<Plating Conditions for Electrolytic Copper Plating in Example 17>

Bath composition:

Copper sulfate hexahydrate: 70 g/L

98% sulfuric acid: 200 g/L

35% hydrochloric acid: 0.15 ml/L

Additives: "Top Lucina" (trademark) SF-based WR: 2.5 ml/L, "TOP Lucina" (trademark) SF-B1: 1.0 ml/L, and "TOP Lucina" (trademark) SF leveler: 5.0 ml/L manufactured by Okuno Chemical Industries Co., Ltd.

Bath temperature: 25° C.

Current density (cathode): 3.0 A/$dm^2$

To the above-described resist pattern on the FCCL of this Example with the electrolytic copper plating formed thereon, spray treatment was applied for exactly 180 seconds using a known amine-based stripper solution, whereby the resist pattern was removed. Further, for the above-described flash etching processing, an etching bath of the following compositions was prepared, and the FCCL after the removal of the resist pattern was subjected to spray treatment at 25° C. for exactly 30 seconds.

<Flash Etching Bath Composition in Example 17>

Bath composition:

35% hydrogen peroxide: 4.5 vol %

98% sulfuric acid: 5 vol %

Copper sulfate pentahydrate: 30 g/L

An FPC of this Example was obtained by the foregoing procedures. To find out specifications of the metal wires in the FPC thus obtained, predetermined ones of the metal wires were cut along a cross-section in a width direction (in a direction orthogonal to the direction of a current), and with the use of a known electron microscope, the height Hw of each wire, the width Lb of the bottom base thereof, the width Lt of the upper surface thereof, the rectangularity A of the conductor shape, the inter-wire distance S, and the conductor wiring density WD described above were measured by the methods which will be described next.

Described specifically, on a sectional image captured by the above-described electron microscope, tangent lines were drawn to the bottom base, a top base, and both side-surfaces of the metal wire. Using these tangent lines as references, the distances between intersections of the tangent lines to the side-surfaces with the tangent lines to the bottom base and the top base were measured as the width Lb of the bottom base and the width Lt of the upper surface on the basis of a scale indicated in the image by the electron microscope. Further, a line is drawn vertically from a midpoint (a point at ½) of the above-described width Lb of the bottom base such that the line intersects the top base, and the distance between the intersection of the line with the top base and the midpoint of the bottom base is measured as the height Hw of the wire, with reference to the scale indicated in the image by the electron microscope.

Figure 7:
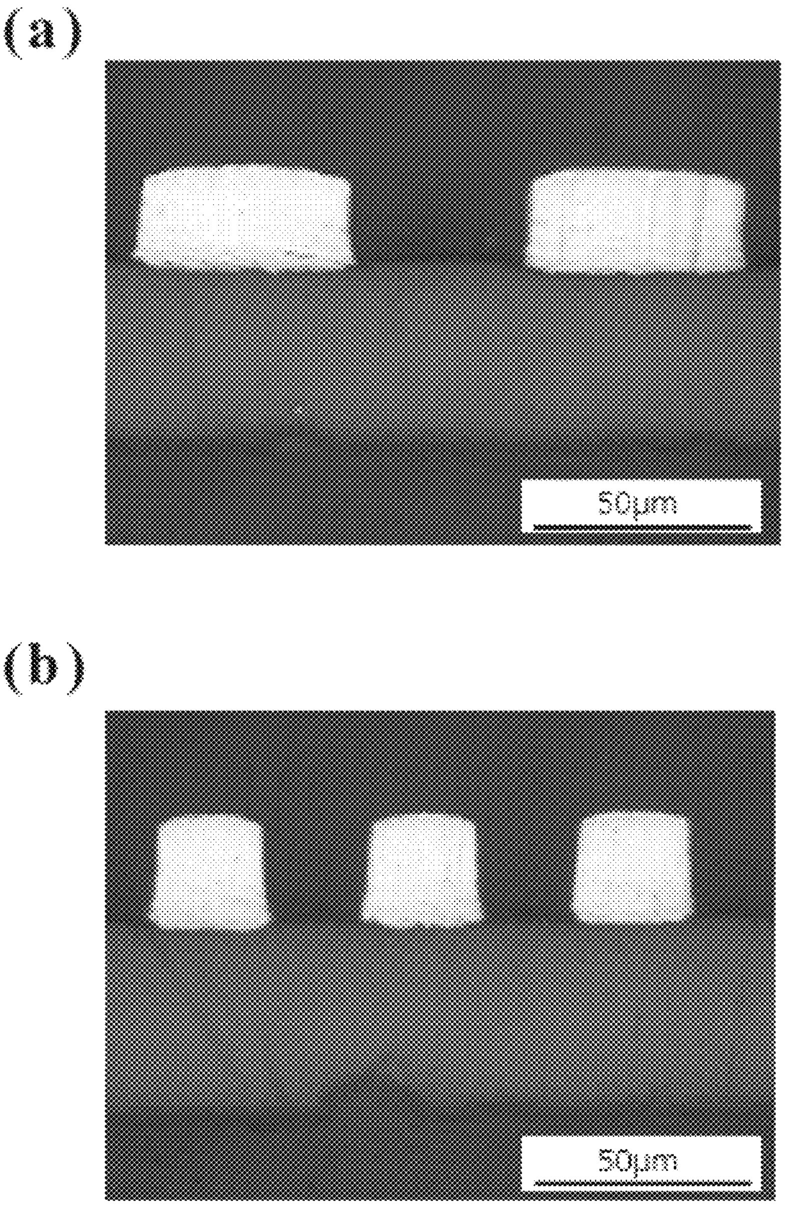
FIG. 7 illustrates, by way of example, images of portions (examples of metal wires) of flexible circuit boards obtained in Examples.

The results thus obtained are illustrated in Table 3. In addition, a portion of the flexible circuit board thus obtained (examples of metal wires) is illustrated in FIG. 7(*a*).

Example 18

The procedures of Example 17 were similarly followed except for a change to an exposure photomask designed to give the width Lb of the bottom base and the inter-wire distance S described in Table 3. The results thus obtained are illustrated in Table 3. In addition, a portion of the flexible circuit board thus obtained (examples of metal wires) is illustrated in FIG. 7(*b*).

Example 19

The procedures of Example 17 were similarly followed except that, as an FCCL, the copper clad laminate 20 produced above in Example 6 was used and that the mask was changed to an exposure photomask designed to give the width Lb of the bottom base and the inter-wire distance S described in Table 3. The results thus obtained are illustrated in Table 3.

Example 20

The procedures of Example 19 were similarly followed except that the exposure photomask was changed to an exposure photomask designed to give the width Lb of the bottom base and the inter-wire distance S described in Table 3. The results thus obtained are illustrated in Table 3.

Example 21

The procedures of Example 19 were similarly followed except that the exposure photomask was changed to an exposure photomask designed to give the width Lb of the bottom base and the inter-wire distance S described in Table 3. The results thus obtained are illustrated in Table 3.

Example 22

The procedures of Example 6 were similarly followed except that, after the preparation of the electroless plating bath, polyethylene glycol (PEG) having a weight-average molecular weight of 1000 was added to the electroless plating bath to a concentration of 0.8 g/L, and that the plating thickness of the electroless Cu—Ni plating layer 2 was changed to 0.3 μm. The results are illustrated in Table 1 and Table 2.

Example 23

The procedures of Example 22 were similarly followed except that, after the preparation of the electroless plating bath, PEG having the weight-average molecular weight of 1000 was added to the electroless plating bath to a concentration of 1.0 g/L. The results are illustrated in Table 1 and Table 2.

Example 24

The procedures of Example 15 were similarly followed except that a first-surface-modifying mixed solution was prepared in the first surface modification step by mixing water (80 vol %) with a mixed solution (20 vol %) of the aqueous solution of potassium hydroxide and monoethanolamine, that the second surface modification was performed, that the plating thickness of the electroless Cu—Ni plating layer 2 was changed to 0.1 μm, and that the heating temperature and heating (soaking) time in the heating (annealing) step were changed to 250° C. and 30 minutes. The results are illustrated in Table 1 and Table 2.

Example 25

The procedures of Example 15 were similarly followed except that a first-surface-modifying mixed solution was prepared in the first surface modification step by mixing water (85 vol %) with the mixed solution (15 vol %) of the aqueous solution of potassium hydroxide and monoethanolamine, that the second surface modification was performed, that the plating thickness of the electroless Cu—Ni plating layer 2 was changed to 0.1 μm, and that the heating temperature and heating (soaking) time in the heating (annealing) step were changed to 250° C. and 30 minutes. The results are illustrated in Table 1 and Table 2.

Example 26

The procedures of Example 17 were similarly followed except that, as an FCCL, the copper clad laminate 20 produced above in Example 24 was used and that the mask was changed to an exposure photomask designed to give the width Lb of the bottom base and the inter-wire distance S described in Table 3. The results thus obtained are illustrated in Table 3.

Example 27

An FPC with metal wiring patterns formed on both sides thereof was produced as in Example 19 except that the height Hw of the wire and L/S (L/S stands for Line and Space and is equivalent to Lb/S in this Example) were set to 12 μm and 25/25 μm, respectively. The board was provided for use as a core layer.

Commercial single-sided copper clad laminates each including a liquid polymer with a thickness of 25 μm and a copper foil with a thickness of 12 μm on one side thereof were then prepared. Using those single-sided copper clad laminates, single-sided flexible circuit boards were each produced by a known subtractive process with a metal wiring pattern formed thereon. They were used as outer layers. Commercial bonding sheets (thickness: 15 μm) were arranged on both sides of the core layer, and the single-sided flexible circuit boards were stacked on both of the outer layers such that the copper foils were positioned on outer sides. After that, the stacked preform was bonded and laminated by a high-temperature press, whereby a four-layered flexible circuit board was obtained.

The total thickness TA of the four-layered flexible circuit board thus obtained was 156 μm, and the thickness per conductor layer was 39 μm. The four-layered flexible circuit board obtained in this Example included high-density and fine-patterned wiring having the four conductor layers. A multilayered flexible circuit board having both high flexibility and high transmission characteristics was therefore obtained.

Figure 9:
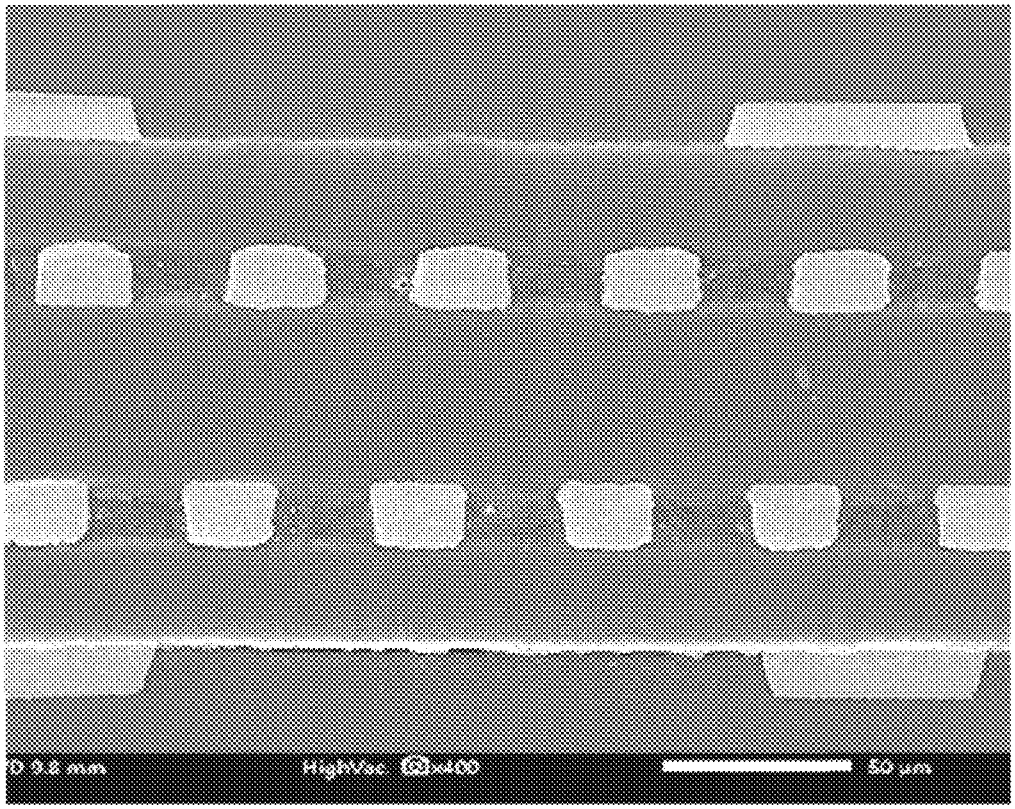
FIG. 9 illustrates, by way of example, an image of portions (examples of metal wires) of a four-layered flexible circuit board obtained in an Example.

In addition, a sectional image (captured by the electron microscope) of a portion of the four-layered flexible circuit board obtained in this Example is illustrated in FIG. 9.

Example 28

A flexible circuit board with metal wiring patterns formed on both sides thereof was produced as in Example 19 except that the height Hw of each wire and L/S (L/S stands for Line and Space and is equivalent to Lb/S in this Example) were set to 12 μm and 20/25 μm, respectively. The board was used as a core layer.

Next, a single-sided flexible circuit board was produced as in Example 27, and a four-layered flexible circuit board was obtained as in Example 27 except that the flexible circuit board was used as a core layer.

The total thickness TA of the four-layered flexible circuit board thus obtained was 164 μm, and the thickness per conductor layer was 41 μm. The four-layered flexible circuit board obtained in this Example included high-density and fine-patterned wiring having the four conductor layers. A multilayered flexible circuit board having both high flexibility and high transmission characteristics was therefore obtained.

Comparative Example 1

The procedures of Example 1 were similarly followed except that the heating (annealing) step was omitted and that the pH in the electroless copper plating conditions was changed to 12.5. The results are illustrated in Table 1 and Table 2.

Comparative Example 2

As an FCCL, a commercial copper clad laminate was prepared. In the FCCL, the thickness of a liquid crystal polymer film was 50 μm, and the thickness of an electrolytic copper foil was 18 μm. To the prepared FCCL, electrolytic copper plating was applied by a known technique such that the thickness of each metal wire (the height Hw of each wire) became 30 μm.

Using the copper clad laminate produced as described above, an FPC was produced by a known subtractive process to be described hereinafter. Described specifically, to the resulting copper clad laminate, a known DFR was bonded by a known roll laminator. The resist was then exposed by a known exposure system to ultraviolet rays through a mask in which a predetermined resist pattern image was formed, whereby positive portions in the resist were cured.

Unexposed portions in the resist were then dissolved and removed with a known alkaline developer solution such as the 1 mass % aqueous solution of sodium carbonate as a developer solution to form a resist pattern on the electroless copper plating layer. On the FCCL of this Comparative Example, which had been obtained above and had the resist pattern formed thereon, wires of conductors were formed by a known etching process using ferric chloride. To the above-described resist pattern on the FCCL of this Example with the electrolytic copper plating formed thereon, spray processing was applied for exactly 60 seconds by using a known amine-based stripper solution, whereby the resist pattern was removed.

Figure 8:
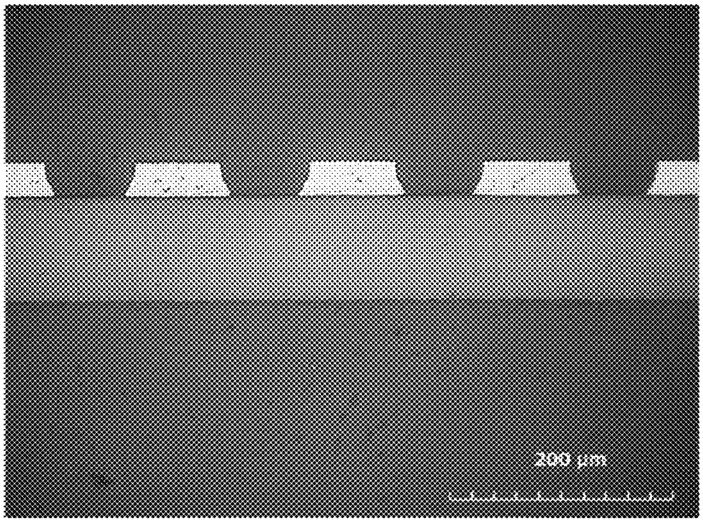
FIG. 8 illustrates, by way of example, images of portions (examples of metal wires) of flexible circuit boards obtained in Comparative Examples.
Figure 8:
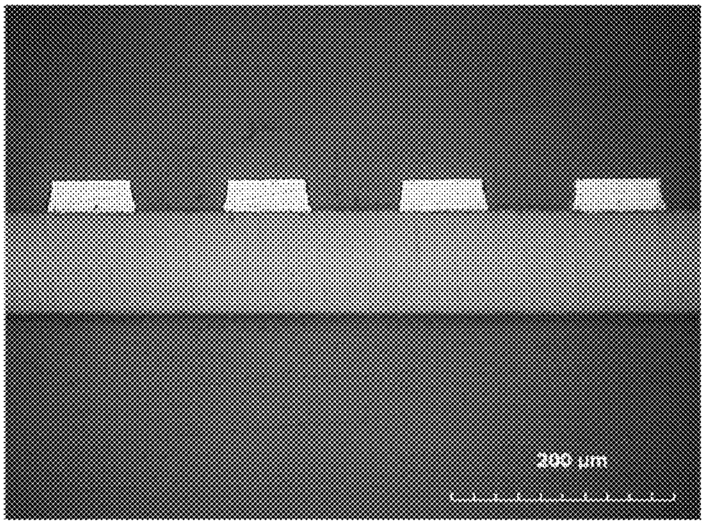

An FPC of Comparative Example 2 was obtained by the foregoing procedures. The specifications of the metal wires in the FPC thus obtained are illustrated in Table 3. In addition, a portion of the flexible circuit board thus obtained (examples of metal wires) is illustrated in FIG. 8(*a*).

Comparative Example 3

The procedures of Comparative Example 2 were similarly followed except that, as a copper clad laminate, a liquid polymer film (50 μm) and a rolled copper foil (18 μm) were used and that the thickness of the metal wire (the height Hw of the wire) after the electrolytic copper plating was set to 29.2 μm. The results are illustrated in Table 3. In addition, a portion of the flexible circuit board thus obtained (examples of metal wires) is illustrated in FIG. 8(*b*).

Comparative Example 4

A commercial smart phone was prepared and disassembled, whereby a flexible circuit board mounted thereon was taken out. The flexible circuit board used a liquid polymer as a board material and had a five-layered stacked structure. Specifications of metal wires in the flexible printed board were examined as in Example 17. The results are illustrated in Table 3.

Comparative Example 5

Specifications of the flexible printed board obtained in Comparative Example 4 and its metal wires at another position were examined as in Example 17. The results are illustrated in Table 3.

TABLE 1

| | Base material | | | First surface modification | | | | | |
|---|---|---|---|---|---|---|---|---|---|
| | Kind of film | Relative permittivity | Dissipation factor | Molar ratio ($—NH_2$/$—OH$) | Temp. (° C.) | ESCA (COOH groups) | TOF-SIMS (peak intensity at m/z 121) | Second surface modification | Catalyst adsorption & reduction Kind |
| Ex. 1 | Low dielectric film | 3.3 | 0.002 | 2.29 | 40 | Present | 1000 | Performed | $PdCl_2$ |
| Ex. 2 | (liquid crystal polymer) | at 10 GHz | at 10 GHz | | | | | | |
| Ex. 3 | | | | | | | | | |
| Ex. 4 | | | | | | | | | |
| Ex. 5 | | | | | | | | | |
| Ex. 6 | | | | | | | | | |
| Ex. 7 | | | | | | | | | |
| Ex. 8 | | | | | | | | | |
| Ex. 9 | | | | | | | | | |
| Ex. 10 | | | | | | | | | |
| Ex. 11 | | | | | | | | | |
| Ex. 12 | | | | | | | | | |
| Ex. 13 | | | | | | | | | |
| Ex. 22 | | | | | | | | | |
| Ex. 23 | | | | | | | | | |
| Ex. 14 | MPI | 3.4 | 0.0035 | 0.19 | 40 | | — | | |
| Ex. 15 | | at 10 GHz | at 10 GHz | 2.29 | | | — | Omitted | |
| Ex. 16 | | | | | | | — | | |
| Ex. 24 | | | | | | | — | Performed | |
| Ex. 25 | | | | | | | — | | |
| Comp. Ex. 1 | Low dielectric film (liquid crystal polymer) | 3.3 at 10 GHz | 0.002 at 10 GHz | 2.29 | 40 | Present | 1000 | Performed | $PdCl_2$ |
| Comp. Ex. 2 | Low dielectric film (liquid crystal polymer) | 3.3 at 10 GHz | 0.002 at 10 GHz | | | | | | |
| Comp. Ex. 3 | Low dielectric film (liquid crystal polymer) | 3.3 at 10 GHz | 0.002 at 10 GHz | | | | | | |
| Comp. Ex. 4 | Low dielectric film (liquid crystal polymer) | 3.3 at 10 GHz | 0.002 at 10 GHz | | | | | | |
| Comp. Ex. 5 | Low dielectric film (liquid crystal polymer) | 3.3 at 10 GHz | 0.002 at 10 GHz | | | | | | |

| | | Electroless plating | | | | | | Heat (annealing) treatment | |
|---|---|---|---|---|---|---|---|---|---|
| | Catalyst adsorption & reduction Activator | Kind of plating | Ni content (wt %) | Thickness (μm) | Bath temp. (° C.) | pH | Weighted average size of crystallites (nm) | Temp. (° C.) | Time (min) |
| Ex. 1 | DMAB | Cu-Ni | 1.18 | 0.2 | 32 | 9.0 | 33.4 | 290 | 10 |
| Ex. 2 | | | | 0.2 | | | 34.7 | 280 | 10 |
| Ex. 3 | | | | 0.2 | | | 30.9 | 270 | 10 |
| Ex. 4 | | | | 0.1-0.3 | | | 33.6 | 260 | 10 |
| Ex. 5 | | | | 0.2 | | | 26.2 | 250 | 10 |
| Ex. 6 | | | | 0.2 | | | 31.5 | | 30 |
| Ex. 7 | | | | 0.2 | | | 28.5 | | 60 |
| Ex. 8 | | | | 0.2 | | | 29.6 | | 120 |
| Ex. 9 | | | | 0.2 | | | 31.0 | | 180 |

TABLE 1-continued

| | | | | | | |
|---|---|---|---|---|---|---|
| Ex. 10 | | 0.1-0.3 | | 28.9 | 220 | 10 |
| Ex. 11 | | 0.2 | | 29.2 | | 60 |
| Ex. 12 | | 0.2 | | 28.5 | | 180 |
| Ex. 13 | | 0.2 | | 36.3 | 200 | 10 |
| Ex. 22 | | 0.3 | | 59.9 | 250 | 30 |
| Ex. 23 | | 0.3 | | 62.4 | 250 | 30 |
| Ex. 14 | | 0.3 | 12.5 | 27.7 | 150 | 60 |
| Ex. 15 | | 0.3 | 9.0 | 28.3 | 220 | 30 |
| Ex. 16 | | 0.3 | | 29.0 | 300 | 60 |
| Ex. 24 | | 0.1 | | 32.5 | 250 | 30 |
| Ex. 25 | | 0.1 | | 34.3 | 250 | 30 |
| Comp. Ex. 1 | DMAB | 0.2 | 12.5 | 20.3 | None | |
| Comp. Ex. 2 | | | | | | |
| Comp. Ex. 3 | | | | | | |
| Comp. Ex. 4 | | | | | | |
| Comp. Ex. 5 | | | | | | |

| | Heat (annealing) treatment Atmosphere | Electrolytic plating Kind of plating | Thickness (μm) | Bath temp. (° C.) | pH | Current density ($A/dm^2$) | Weighted average size of crystallites (nm) |
|---|---|---|---|---|---|---|---|
| Ex. 1 | Inert gas ($N_2$) | Cu | 18 | 20 to 25 | <1 | 2 to 3 | 53.0 |
| Ex. 2 | | | | | | | 44.4 |
| Ex. 3 | | | | | | | 50.7 |
| Ex. 4 | | | | | | | 50.5 |
| Ex. 5 | | | | | | | 44.7 |
| Ex. 6 | | | | | | | 40.7 |
| Ex. 7 | | | | | | | 49.1 |
| Ex. 8 | | | | | | | 51.0 |
| Ex. 9 | | | | | | | 48.3 |
| Ex. 10 | | | | | | | 46.4 |
| Ex. 11 | | | | | | | 44.9 |
| Ex. 12 | | | | | | | 48.0 |
| Ex. 13 | Atmosphere | | | | | | — |
| Ex. 22 | Inert gas ($N_2$) | | | | | | 71.8 |
| Ex. 23 | | | | | | | 75.0 |
| Ex. 14 | Atmosphere | | | | | | 43.9 |
| Ex. 15 | Inert gas ($N_2$) | | | | | | 43.8 |
| Ex. 16 | | | | | | | 45.6 |
| Ex. 24 | | | | | | | 47.3 |
| Ex. 25 | | | | | | | 48.1 |
| Comp. Ex. 1 | None | | | | | | 43.9 |
| Comp. Ex. 2 | | | 12 | | | | — |
| Comp. Ex. 3 | | | 12 | | | | — |
| Comp. Ex. 4 | | | — | — | — | — | — |
| Comp. Ex. 5 | | | — | — | — | — | — |

TABLE 2

| | Contact angle on modified film surface after peeling of plating layer | Ra (μm) after peeling of plating layer | Crystallite size of electrolytic plating/crystallite size of electroless plating | Peel strength | |
|---|---|---|---|---|---|
| | | | | Tape peel strength of plating layer | Peel strength after plating (N/cm) |
| Ex. 1 | 26° | 0.046 | 1.59 | ○ | 9.6 |
| Ex. 2 | | | 1.28 | ○ | 8.8 |
| Ex. 3 | | | 1.64 | ○ | 7.9 |
| Ex. 4 | | | 1.50 | ○ | 7.9 (plating thickness: 0.1 μm) |
| | | | | ○ | 7.6 (plating thickness: 0.2 μm) |
| | | | | ○ | 8.2 (plating thickness: 0.3 μm) |
| Ex. 5 | | | 1.71 | ○ | 6.2 |
| Ex. 6 | | | 1.29 | ○ | 6.5 |
| Ex. 7 | | | 1.72 | ○ | 7.5 |
| Ex. 8 | | | 1.72 | ○ | 7.2 |
| Ex. 9 | | | 1.56 | ○ | 7.6 |
| Ex. 10 | | | 1.61 | ○ | 7.1 (plating thickness: 0.1 μm) |
| | | | | ○ | 6.7 (plating thickness: 0.2 μm) |
| | | | | ○ | 7.0 (plating thickness: 0.3 μm) |
| Ex. 11 | | | 1.54 | ○ | 7.6 |
| Ex. 12 | | | 1.68 | ○ | 7.2 |
| Ex. 13 | | | — | ○ | 5.4 |
| Ex. 22 | | | 1.20 | ○ | 7.1 |
| Ex. 23 | | | 1.20 | ○ | 7.2 |
| Ex. 14 | 41° | 0.004 | 1.58 | ○ | 4.8 |
| Ex. 15 | | | 1.55 | ○ | 7.3 |
| Ex. 16 | | | 1.57 | ○ | 8.2 |
| Ex. 24 | | | 1.45 | ○ | 7.4 |
| Ex. 25 | | | 1.40 | ○ | 6.9 |
| Comp. Ex. 1 | 26° | 0.046 | 2.16 | x | 0.2 |

| | Appearance inspection | Volume resistivity (μΩ · cm) | | Comprehensive evaluation |
|---|---|---|---|---|
| | | Electroless plating | Electrolytic plating | |
| Ex. 1 | Good | 2.32 | 2.28 | ○ |
| Ex. 2 | Good | 2.23 | 2.02 | ○ |
| Ex. 3 | Good | 2.74 | 2.31 | ○ |
| Ex. 4 | Good | 2.36 | 2.26 | ○ |
| | Good | | | ○ |
| | Good | | | ○ |
| Ex. 5 | Good | 4.28 | 2.35 | ○ |
| Ex. 6 | Good | 3.97 | 2.33 | ○ |
| Ex. 7 | Good | 4.02 | 2.63 | ○ |
| Ex. 8 | Good | 3.79 | 2.3 | ○ |
| Ex. 9 | Good | 3.28 | 2.11 | ○ |
| Ex. 10 | Good | 4.32 | 2.66 | ○ |
| | Good | | | ○ |
| | Good | | | ○ |
| Ex. 11 | Good | 3.92 | 1.93 | ○ |
| Ex. 12 | Good | 4.29 | 2.46 | ○ |
| Ex. 13 | Good | — | 2.38 | ○ |
| Ex. 22 | Good | 2.10 | 2.22 | ○ |
| Ex. 23 | Good | 1.90 | 2.13 | ○ |
| Ex. 14 | Good | 6.89 | 2.34 | ○ |
| Ex. 15 | Good | 5.80 | 2.33 | ○ |
| Ex. 16 | Good | 4.90 | 2.3 | ○ |
| Ex. 24 | Good | 3.86 | 2.25 | ○ |
| Ex. 25 | Good | 3.91 | 2.18 | ○ |
| Comp. Ex. 1 | Good | 6.89 | 2.28 | x |

| | | | Specifications of metal wire | | | | | | | |
|---|---|---|---|---|---|---|---|---|---|---|
| | Base material resin in FCCL | FPC production process | Height Hw (μm) | Bottom base width Lb (μm) | Upper surface width Lt (μm) | Lb-Lt (μm) | Rectangularity A (H/(Lb-Lt)) | Inter-wire distance S (μm) | Conductor wiring density WD (S/A) (μm) |
| Ex. 17 | Liquid crystal | SAP | 27.2 | 50.0 | 46.3 | 3.7 | 7.4 | 40.7 | 5.5 |
| Ex. 18 | polymer (Ex. 9) | SAP | 25.6 | 27.0 | 22.6 | 4.4 | 5.8 | 22.2 | 3.8 |
| Ex. 19 | Liquid crystal | SAP | 16.0 | 24.9 | 22.5 | 2.4 | 6.7 | 31.6 | 4.7 |
| Ex. 20 | polymer (Ex. 6) | SAP | 15.9 | 20.8 | 17.7 | 3.1 | 5.1 | 29.7 | 5.8 |
| Ex. 21 | | SAP | 16.0 | 15.8 | 12.9 | 2.9 | 5.5 | 29.9 | 5.4 |
| Ex. 26 | MPI (Ex. 24) | SAP | 17.4 | 24.1 | 22.0 | 2.1 | 8.3 | 25.9 | 3.1 |
| Comp. Ex. 2 | Low dielectric film (liquid crystal polymer) | Subtractive | 30.0 | 96.9 | 76.8 | 20.1 | 1.5 | 60.2 | 40.3 |
| Comp. Ex. 3 | Low dielectric film (liquid crystal polymer) | Subtractive | 29.2 | 87.3 | 79.0 | 8.3 | 3.5 | 79.0 | 22.5 |
| Comp. Ex. 4 | Low dielectric film (liquid crystal polymer) | Subtractive | 16.9 | 50.0 | 43.8 | 6.2 | 2.7 | 46.0 | 16.9 |
| Comp. Ex. 5 | Low dielectric film (liquid crystal polymer) | Subtractive | 12.3 | 51.5 | 45.3 | 6.2 | 2.0 | 46.0 | 23.2 |

INDUSTRIAL APPLICABILITY

The copper clad laminate of the present invention can achieve high adhesiveness and a good volume resistivity while suppressing a transmission loss. It is therefore evident that the copper clad laminate of the present invention is suitably applied to a wiring board or the like for which fine wiring of a multilayered structure is required.

REFERENCE SIGNS LIST

1: Resin film
2: Electroless copper plating layer
3: Electrolytic copper plating layer
10: Copper clad laminate

The invention claimed is:

1. A copper clad laminate comprising:

a low dielectric resin film having a relative permittivity of 3.5 or lower and a dissipation factor of 0.008 or lower at a frequency of 10 GHz; and an electroless copper plating layer laminated on at least one surface of the low dielectric resin film, wherein a weighted average size of crystallites in the electroless copper plating layer is 25 to 300 nm, and an adhesion strength between the resin film and the electroless copper plating layer is 4.2 N/cm or more.

2. The copper clad laminate according to claim 1, wherein the electroless copper plating layer has a volume resistivity of 7.0 μΩ·cm or lower.

3. The copper clad laminate according to claim 1, further comprising:

an electrolytic copper plating layer laminated on the electroless copper plating layer, wherein a weighted average size of crystallites in the electrolytic copper plating layer is 40 to 300 nm.

4. The copper clad laminate according to claim 1, further comprising:

an electrolytic copper plating layer laminated on the electroless copper plating layer, wherein, assuming that the weighted average size of the crystallites in the electroless copper plating layer is first crystallites and the weighted average size of the crystallites in the electrolytic copper plating layer is second crystallites, a ratio of the first crystallites to the second crystallites (the second crystallites/the first crystallites) is 2.0 or smaller.

5. A copper clad laminate comprising:

a low dielectric resin film having a relative permittivity of 3.5 or lower and a dissipation factor of 0.008 or lower at a frequency of 10 GHz; and an electroless copper plating layer laminated on at least one surface of the low dielectric resin film, wherein the copper clad laminate includes an electrolytic copper plating layer on the electroless copper plating layer, a weighted average size of crystallites in the electrolytic copper plating layer is 40 to 300 nm, assuming that a weighted average size of crystallites in the electroless copper plating layer is first crystallites and the weighted average size of the crystallites in the electrolytic copper plating layer is second crystallites, a ratio of the first crystallites to the second crystallites (the second crystallites/the first crystallites) is 2.0 or smaller, and an adhesion strength between the resin film and the electroless copper plating layer is 4.2 N/cm or more.

6. The copper clad laminate according to claim 5, wherein the weighted average size of the crystallites in the electroless copper plating layer is 25 to 300 nm.

7. The copper clad laminate according to claim 3, wherein the electrolytic copper plating layer has a volume resistivity of 5.0 μΩ·cm or lower.

8. The copper clad laminate according to claim 1, wherein the low dielectric resin film includes any of polyimides, modified polyimides, liquid crystal polymers, and fluorinated resins, or a mixture thereof.

9. The copper clad laminate according to claim 1, wherein the low dielectric resin film has an average surface roughness Ra of 1 to 150 nm on a plating-layer-side interface where the low dielectric resin film is in contact with the electroless copper plating layer, the resin film has an intensity of 800 or more at m/z 121 on the plating-layer-side interface as measured by time-of-flight secondary ion mass spectroscopy, and the resin film is provided on the plating-layer-side interface with hydroxyl groups and/or carboxyl groups.

10. A method for producing a copper clad laminate by forming an electroless copper plating layer on a low dielectric resin film having a relative permittivity of 3.5 or lower and a dissipation factor of 0.008 or lower at a frequency of 10 GHz, the method comprising:

an electroless copper plating step of forming the electroless copper plating layer on a surface of the low dielectric resin film; and a heating step of heating the copper clad laminate in which the electroless copper plating layer has been formed, such that a weighted average size of crystallites in the electroless copper plating layer becomes 25 to 300 nm and an adhesion strength between the resin film and the electroless copper plating layer is 4.2 N/cm or more.

11. The method for producing a copper clad laminate according to claim 10, wherein the copper clad laminate is heated in the heating step under either (i) heating conditions of 150° C. to 200° C. for 10 to 180 minutes in an atmosphere or (ii) heating conditions of 150° C. to 350° C. for 5 to 180 minutes in an inert gas.

12. The method for producing a copper clad laminate according to claim 10, wherein the heating step is performed before a resist patterning step is performed onto the electroless copper plating layer.

13. The method for producing a copper clad laminate according to claim 10, further comprising:

before the electroless copper plating step, a first surface modification step of providing carboxyl groups and/or hydroxyl groups on the surface of the low dielectric resin film;

a second surface modification step of applying electric charges to the surface on which the carboxyl groups and/or the hydroxyl groups have been provided, by a wet process; and a catalyst adsorption step of causing a catalyst to be adsorbed on the surface to which the electric charges have been applied, wherein the electroless copper plating layer is formed on the surface on which the catalyst has been adsorbed.

14. A flexible circuit board comprising:

a circuit formed by the copper clad laminate according to claim 1.

15. A method for producing a flexible circuit board by using a low dielectric resin film, the method comprising:

an electroless copper plating step of forming an electroless copper plating layer on the low dielectric resin film having a relative permittivity of 3.5 or lower and a dissipation factor of 0.008 or lower at a frequency of 10 GHZ;

a resist patterning step of applying a resist onto the electroless copper plating layer and patterning the resist;

an electrolytic copper plating step of forming an electrolytic copper plating layer between portions of the patterned resist; and a heating step of, before the resist patterning step, heating the copper clad laminate in which the electroless copper plating layer has been formed, such that a weighted average size of crystallites in the electroless copper plating layer becomes 25 to 300 nm and an adhesion strength between the resin film and the electroless copper plating layer is 4.2 N/cm or more.

16. The flexible circuit board according to claim 14, comprising:

the circuit of metal wires formed by the copper clad laminate on the low dielectric resin film, wherein, assuming that a height of each metal wire from the low dielectric resin film is Hw, a width of a bottom base of the metal wire in contact with the low dielectric film is Lb, a width of an upper surface of the metal wire is Lt, and an inter-wire distance from another adjacent metal wire on the low dielectric resin film is S, at least some of the metal wires each have a conductor shape with a rectangularity A of 2.5 or greater, the rectangularity A being defined by a value (Hw/(Lb−Lt)) obtained by dividing the height of the metal wire by a difference between the width of the bottom base and the width of the upper surface, S of 60 μm or smaller, and a conductor wiring density WD of 10.0 or lower, the conductor wiring density WD being defined by a value (S/A) obtained by dividing the inter-wire distance by the rectangularity of the conductor shape.

* * * * *